(12) United States Patent
Katsavounidis et al.

(10) Patent No.: US 6,876,705 B2
(45) Date of Patent: Apr. 5, 2005

(54) SYSTEMS AND METHODS FOR DECODING OF PARTIALLY CORRUPTED REVERSIBLE VARIABLE LENGTH CODE (RVLC) INTRA-CODED MACROBLOCKS AND PARTIAL BLOCK DECODING OF CORRUPTED MACROBLOCKS IN A VIDEO DECODER

(75) Inventors: Ioannis Katsavounidis, Pasadena, CA (US); Chang-Su Kim, Seoul (KR); Jong Won Kim, GwangJu (KR)

(73) Assignee: Intervideo, Inc., Fremont, CA (US)

( * ) Notice: Subject to any disclaimer, the term of this patent is extended or adjusted under 35 U.S.C. 154(b) by 358 days.

(21) Appl. No.: 10/092,376

(22) Filed: Mar. 5, 2002

(65) Prior Publication Data

US 2002/0181594 A1 Dec. 5, 2002

Related U.S. Application Data

(60) Provisional application No. 60/273,443, filed on Mar. 5, 2001, provisional application No. 60/275,859, filed on Mar. 14, 2001, and provisional application No. 60/286,280, filed on Apr. 25, 2001.

(51) Int. Cl.[7] .............................................. H04B 1/66
(52) U.S. Cl. ........................... 375/240.28; 375/240.27; 375/240.25; 375/240.26; 714/799; 714/798; 370/498; 370/479; 370/503; 370/510; 370/512; 370/514; 709/247
(58) Field of Search ...................... 375/240.28, 240.27, 375/240.25, 240.26; 709/247; 714/799, 798; 370/498, 510, 512, 514, 479, 503

(56) References Cited

U.S. PATENT DOCUMENTS

| 5,436,664 | A | 7/1995 | Henry |
|---|---|---|---|
| 5,502,573 | A | 3/1996 | Fujinami |
| 5,912,707 | A | 6/1999 | Kim |
| 5,936,674 | A | 8/1999 | Kim |
| 5,995,171 | A | 11/1999 | Enari et al. |
| 6,141,448 | A | 10/2000 | Khansari et al. |
| 6,148,026 | A | 11/2000 | Puri et al. |

OTHER PUBLICATIONS

U.S. Appl. No. 10/092,366, filed Mar. 5, 2002, Kim et al.
U.S. Appl. No. 10/092,353, filed Mar. 5, 2002, Katsavounidis et al.
U.S. Appl. No. 10/092,384, filed Mar. 5, 2002, Kim et al.
U.S. Appl. No. 10/092,340, filed Mar. 5, 2002, Kim et al.
U.S. Appl. No. 10/092,375, filed Mar. 5, 2002, Kim et al.
U.S. Appl. No. 10/092,345, filed Mar. 5, 2002, Kim et al.
U.S. Appl. No. 10/092,392, filed Mar. 5, 2002, Katsavounidis et al.
U.S. Appl. No. 10/092,383, filed Mar. 5, 2002, Zhao et al.
U.S. Appl. No. 10/092,373, filed Mar. 5, 2002, Kim et al.
U.S. Appl. No. 10/092,339, filed Mar. 5, 2002, Kim et al.
U.S. Appl. No. 10/092,394, filed Mar. 5, 2002, Katsavounidis et al.

*Primary Examiner*—Shawn S. An
(74) *Attorney, Agent, or Firm*—Rosenberg, Klein & Lee

(57) ABSTRACT

The invention is related to methods and apparatus that recover usable video data from partially corrupted data. Embodiments inspect corrupted data packets and identify the location or locations of an error, whether the corrupted data packet contains data expected to be error-free, and whether the error-free data should be used. Decoding of a packet in both the forward direction and the backward direction can be used to locate a position of an error. Intra-coded macroblocks can also be recovered. A decoder can elect to use or to drop an intra-coded macroblock recovered from a corrupted data packet according to further criteria that is applied to the recovered intra-coded macroblock. One embodiment inspects video bitstream data that has been encoded with an optional data partitioning feature enabled, and retrieves specified data in areas of a corrupted packet that are expected to be free from error.

9 Claims, 20 Drawing Sheets

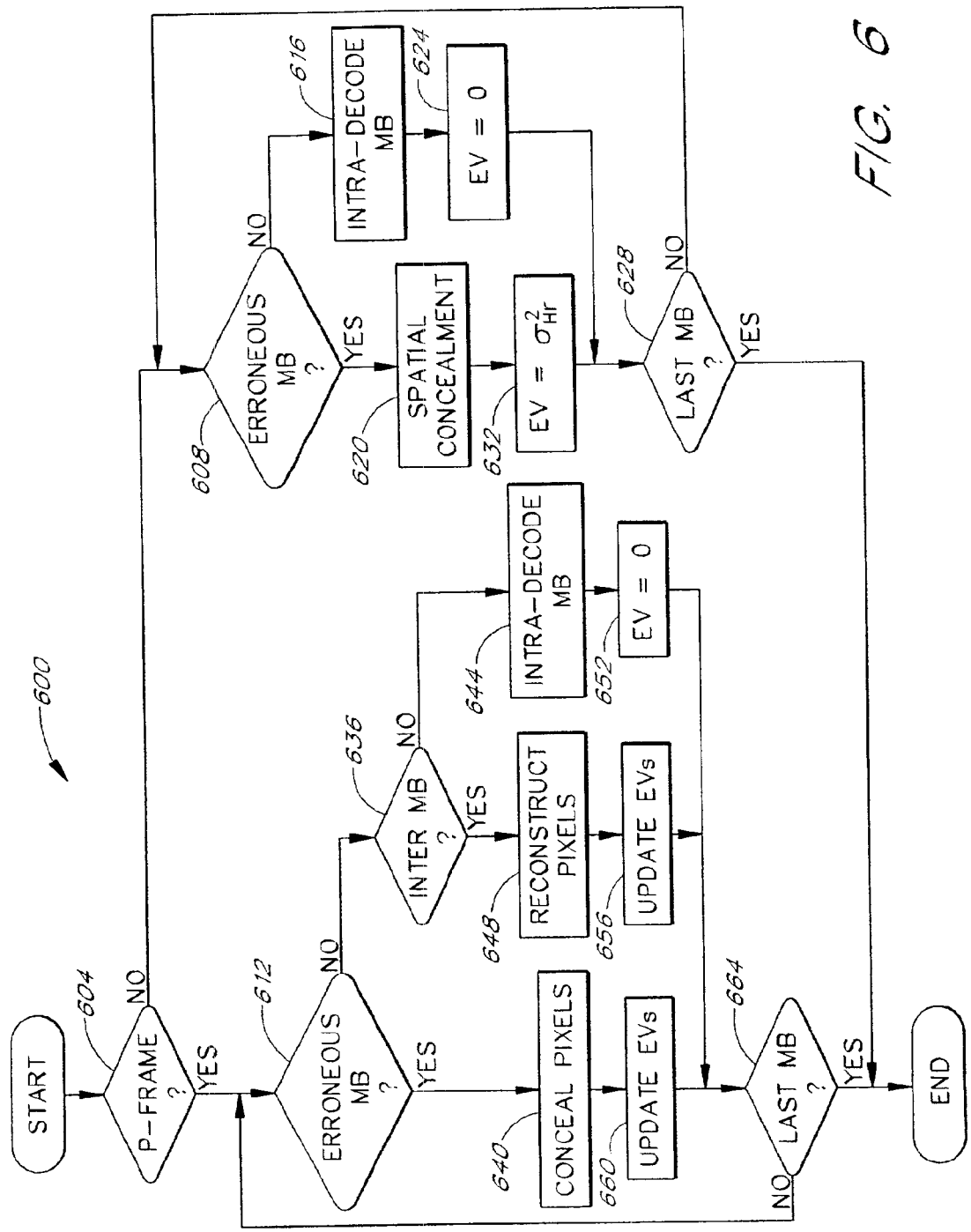

SYSTEMS AND METHODS FOR DECODING OF PARTIALLY CORRUPTED REVERSIBLE VARIABLE LENGTH CODE (RVLC) INTRA-CODED MACROBLOCKS AND PARTIAL BLOCK DECODING OF CORRUPTED MACROBLOCKS IN A VIDEO DECODER

RELATED APPLICATION

This application claims the benefit under 35 U.S.C. §119 (e) of U.S. Provisional Application No. 60/273,443, filed Mar. 5, 2001; U.S. Provisional Application No. 60/275,859, filed Mar. 14, 2001; and U.S. Provisional Application No. 60/286,280, filed Apr. 25, 2001, the entireties of which are hereby incorporated by reference.

APPENDIX A

Appendix A, which forms a part of this disclosure, is a list of commonly owned copending U.S. patent applications. Each one of the applications listed in Appendix A is hereby incorporated herein in its entirety by reference thereto.

COPYRIGHT RIGHTS

A portion of the disclosure of this patent document contains material which is subject to copyright protection. The copyright owner has no objection to the facsimile reproduction by any one of the patent document or the patent disclosure, as it appears in the Patent and Trademark Office patent file or records, but otherwise reserves all copyright rights whatsoever.

BACKGROUND OF THE INVENTION

1. Field of the Invention

The invention is related to video decoding techniques. In particular, the invention relates to systems and methods of recovering usable video data from partially corrupted data.

2. Description of the Related Art

A variety of digital video compression techniques have arisen to transmit or to store a video signal with a lower bandwidth or with less storage space. Such video compression techniques include international standards, such as H.261, H.263, H.263+, H.263++, H.26L, MPEG-1, MPEG-2, MPEG-4, and MPEG-7. These compression techniques achieve relatively high compression ratios by discrete cosine transform (DCT) techniques and motion compensation (MC) techniques, among others. Such video compression techniques permit video bitstreams to be efficiently carried across a variety of digital networks, such as wireless cellular telephony networks, computer networks, cable networks, via satellite, and the like.

Unfortunately for users, the various mediums used to carry or transmit digital video signals do not always work perfectly, and the transmitted data can be corrupted or otherwise interrupted. Such corruption can include errors, dropouts, and delays. Corruption occurs with relative frequency in some transmission mediums, such as in wireless channels and in asynchronous transfer mode (ATM) networks. For example, data transmission in a wireless channel can be corrupted by environmental noise, multipath, and shadowing. In another example, data transmission in an ATM network can be corrupted by network congestion and buffer overflow.

Corruption in a data stream or bitstream that is carrying video can cause disruptions to the displayed video. Even the loss of one bit of data can result in a loss of synchronization with the bitstream, which results in the unavailability of subsequent bits until a synchronization codeword is received. These errors in transmission can cause frames to be missed, blocks within a frame to be missed, and the like. One drawback to a relatively highly compressed data stream is an increased susceptibility to corruption in the transmission of the data stream carrying the video signal.

Those in the art have sought to develop techniques to mitigate against the corruption of data in the bitstream. For example, error concealment techniques can be used in an attempt to hide errors in missing or corrupted blocks. However, conventional error concealment techniques can be relatively crude and unsophisticated.

In another example, forward error correction (FEC) techniques are used to recover corrupted bits, and thus reconstruct data in the event of corruption. However, FEC techniques disadvantageously introduce redundant data, which increases the bandwidth of the bitstream for the video or decreases the amount of effective bandwidth remaining for the video. Also, FEC techniques are computationally complex to implement. In addition, conventional FEC techniques are not compatible with the international standards, such as H.261, H.263, MPEG-2, and MPEG-4, but instead, have to be implemented at a higher, "systems" level.

SUMMARY OF THE INVENTION

The invention is related to methods and apparatus that recover usable video data from partially corrupted data. Embodiments inspect corrupted data packets and identify the location or locations of an error, whether the corrupted data packet contains data expected to be error-free, and whether the error-free data should be used. Decoding of a packet in both the forward direction and the backward direction can be used to locate a position of an error. Intra-coded macroblocks can also be recovered. A decoder can elect to use or to drop an intra-coded macroblock recovered from a corrupted data packet according to further criteria that is applied to the recovered intra-coded macroblock. One embodiment inspects video bitstream data that has been encoded with an optional data partitioning feature enabled, and retrieves specified data in areas of a corrupted packet that are expected to be free from error.

One embodiment of the invention includes a circuit adapted to recover useful data from a video packet that is at least partially corrupted, the circuit comprising: a decoding circuit configured to decode a video packet in a forward direction and in a backward direction, where the decoding circuit detects bit locations of errors first encountered in the forward direction and in the backward direction; a counter adapted to maintain a count of complete macroblocks decoded in the forward direction and in the backward direction; and a control circuit adapted to discard at least a portion of the video packet that corresponds to an overlapping region, where the control circuit is further configured to further discard additional data corresponding to a backtracking amount when there is no overlapping region, where the control circuit is further configured to discard information in incomplete macroblocks, and where the control circuit is adapted to permit use of at least a portion of the remaining data.

One embodiment of the invention includes a circuit adapted to recover useful data from a video packet that is at least partially corrupted, the circuit comprising: a data parsing circuit adapted to determine whether a video packet is encoded with data partitioning enabled; an error checking circuit configured to determine whether an error exists ahead of a motion marker of the video packet; and a decoder coupled to the data parsing circuit and to the error checking circuit, where the decoder is adapted to decode at least a portion of the data in the corrupted video packet ahead of the motion marker when data parsing circuit indicates that the video packet is encoded with data partitioning enabled and when the error checking circuit indicates that the error does not exist ahead of the motion marker.

One embodiment of the invention includes a circuit adapted to recover useful data from a video packet that is at least partially corrupted, the circuit comprising: means for receiving the video packet; means for ending without recovering data when corruption is detected in at least one of a video packet header of the video packet, a DC portion of the video packet, and a motion vector portion of the video packet; means for initiating decoding of the video packet in a forward direction; means for maintaining a first count of a number of macroblocks decoded without error in the forward direction; means for storing codewords decoded in the forward direction; means for storing a first bit location when an error is first detected in the forward direction; means for initiating decoding of the video packet in a reverse direction; means for maintaining a second count of a number of macroblocks decoded without error in the reverse direction; means for storing codewords decoded in the reverse direction; means for storing a second bit location when an error is first detected in the reverse direction; means for determining if there is an overlapping region, where the overlapping region corresponds to a region identified in both the forward direction and in the reverse direction as having an error; means for discarding the data in the overlapping region and for using the data in a remaining portion of the video packet if there is an overlapping region; and means for discarding the data between a first backtracking amount ahead of the first error location in the forward direction and a second backtracking amount behind the second error location in the first location, and for recovering the remaining portion of the video packet if there is no overlapping region.

One embodiment of the invention includes a method of recovering useful data from a video packet that has been corrupted, the method comprising: receiving the video packet; ending without recovering data when corruption is detected in a video packet header of the video packet; ending without recovering data when corruption is detected in a DC portion of the video packet; ending without recovering data when corruption is detected in a motion vector portion of the video packet; initiating decoding of the video packet in a forward direction; maintaining a first count of a number of macroblocks decoded without error in the forward direction; storing codewords decoded in the forward direction; storing a first bit location when an error is first detected in the forward direction; initiating decoding of the video packet in a reverse direction; maintaining a second count of a number of macroblocks decoded without error in the reverse direction; storing codewords decoded in the reverse direction; storing a second bit location when an error is first detected in the reverse direction; determining if there is an overlapping region, where the overlapping region corresponds to a region identified in both the forward direction and in the reverse direction as having an error; if there is an overlapping region, discarding the data in the overlapping region and using the data in a remaining portion of the video packet; and if there is no overlapping region, discarding the data between a first backtracking amount ahead of the first error location in the forward direction and a second backtracking amount behind the second error location in the first location, and recovering the remaining portion of the video packet.

One embodiment of the invention includes method for recovering data in a corrupted video packet comprising: inspecting the video packet to determine whether the video packet was encoded with data partitioning enabled; determining whether an error exists ahead of a motion marker of the video packet; and decoding at least a portion of the data in the corrupted video packet ahead of the motion marker when the video packet was encoded with data partitioning enabled and when the error does not exist ahead of the motion marker.

BRIEF DESCRIPTION OF THE DRAWINGS

These and other features of the invention will now be described with reference to the drawings summarized below. These drawings and the associated description are provided to illustrate preferred embodiments of the invention and are not intended to limit the scope of the invention.

FIG. 6 is a flowchart generally illustrating a process that can use weighted predictions to compensate for errors in a video bitstream.

DETAILED DESCRIPTION OF PREFERRED EMBODIMENTS

Although this invention will be described in terms of certain preferred embodiments, other embodiments that are apparent to those of ordinary skill in the art, including embodiments that do not provide all of the benefits and features set forth herein, are also within the scope of this invention. Accordingly, the scope of the invention is defined only by reference to the appended claims.

The display of video can consume a relatively large amount of bandwidth, especially when the video is displayed in real time. Moreover, when the video bitstream is wirelessly transmitted or is transmitted over a congested network, packets may be lost or unacceptably delayed. Even when a packet of data in a video bitstream is received, if the packet is not timely received due to network congestion and the like, the packet may not be usable for decoding of the video bitstream in real time. Embodiments of the invention advantageously compensate for and conceal errors that occur when packets of data in a video bitstream are delayed, dropped, or lost. Some embodiments reconstruct the original data from other data. Other embodiments conceal or hide the result of errors so that a corresponding display of the video bitstream exhibits relatively fewer errors, thereby effectively increasing the signal-to-noise ratio (SNR) of the system. Further advantageously, embodiments of the invention can remain downward compatible with video bitstreams that are compliant with existing video encoding standards.

Figure 1:
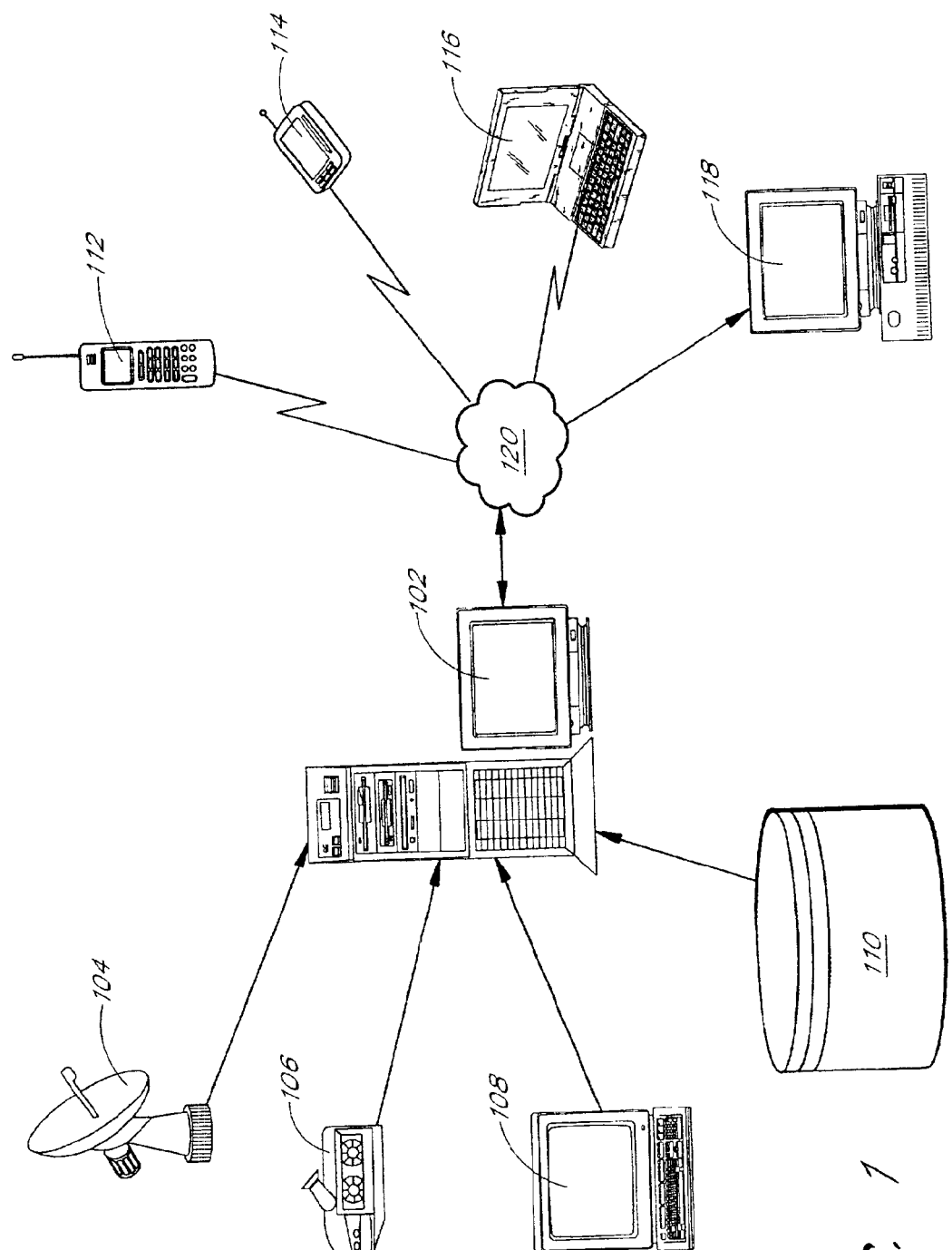
FIG. 1 illustrates a networked system for implementing a video distribution system in accordance with one embodiment of the invention.

FIG. 1 illustrates a networked system for implementing a video distribution system in accordance with one embodiment of the invention. An encoding computer 102 receives a video signal, which is to be encoded to a relatively compact and robust format. The encoding computer 102 can correspond to a variety of machine types, including general purpose computers that execute software and to specialized hardware. The encoding computer 102 can receive a video sequence from a wide variety of sources, such as via a satellite receiver 104, a video camera 106, and a video conferencing terminal 108. The video camera 106 can correspond to a variety of camera types, such as video camera recorders, Web cams, cameras built into wireless devices, and the like. Video sequences can also be stored in a data store 110. The data store 110 can be internal to or external to the encoding computer 102. The data store 110 can include devices such as tapes, hard disks, optical disks, and the like. It will be understood by one of ordinary skill in the art that a data store, such as the data store 110 illustrated in FIG. 1, can store unencoded video, encoded video, or both. In one embodiment, the encoding computer 102 retrieves unencoded video from a data store, such as the data store 110, encodes the unencoded video, and stores the encoded video to a data store, which can be the same data store or another data store. It will be understood that a source for the video can include a source that was originally taken in a film format.

The encoding computer 102 distributes the encoded video to a receiving device, which decodes the encoded video. The receiving device can correspond to a wide variety of devices that can display video. For example, the receiving devices shown in the illustrated networked system include a cell phone 112, a personal digital assistant (PDA) 114, a laptop computer 116, and a desktop computer 118. The receiving devices can communicate with the encoding computer 102 through a communication network 120, which can correspond to a variety of communication networks including a wireless communication network. It will be understood by one of ordinary skill in the art that a receiving device, such as the cell phone 112, can also be used to transmit a video signal to the encoding computer 102.

The encoding computer 102, as well as a receiving device or decoder, can correspond to a wide variety of computers. For example, the encoding computer 102 can be any microprocessor or processor (hereinafter referred to as processor) controlled device, including, but not limited to a terminal device, such as a personal computer, a workstation, a server, a client, a mini computer, a main-frame computer, a laptop computer, a network of individual computers, a mobile computer, a palm top computer, a hand held computer, a set top box for a TV, an interactive television, an interactive kiosk, a personal digital assistant (PDA), an interactive wireless communications device, a mobile browser, a Web enabled cell phone, or a combination thereof. The computer may further possess input devices such as a keyboard, a mouse, a trackball, a touch pad, or a touch screen and output devices such as a computer screen, printer, speaker, or other input devices now in existence or later developed.

The encoding computer 102, as well as a decoder, described can correspond to a uniprocessor or multiprocessor machine. Additionally, the computers can include an addressable storage medium or computer accessible medium, such as random access memory (RAM), an electronically erasable programmable read-only memory (EEPROM), hard disks, floppy disks, laser disk players, digital video devices, Compact Disc ROMs, DVD-ROMs, video tapes, audio tapes, magnetic recording tracks, electronic networks, and other techniques to transmit or store electronic content such as, by way of example, programs and data. In one embodiment, the computers are equipped with a network communication device such as a network interface card, a modem, Infra-Red (IR) port, or other network connection device suitable for connecting to a network. Furthermore, the computers execute an appropriate operating system, such as Linux, Unix, Microsoft® Windows® 3.1, Microsoft® Windows® 95, Microsoft® Windows® 98, Microsoft® Windows® NT, Microsoft® Windows® 2000, Microsoft® Windows® Me, Microsoft® Windows® XP, Apple® MacOS®, IBM® OS/2®, Microsoft® Windows® CE, or Palm OS®. As is conventional, the appropriate operating system may advantageously include a communications protocol implementation, which handles all incoming and outgoing message traffic passed over the network, which can include a wireless network. In other embodiments, while the operating system may differ depending on the type of computer, the operating system may continue to provide the appropriate communications protocols necessary to establish communication links with the network.

Figure 2:
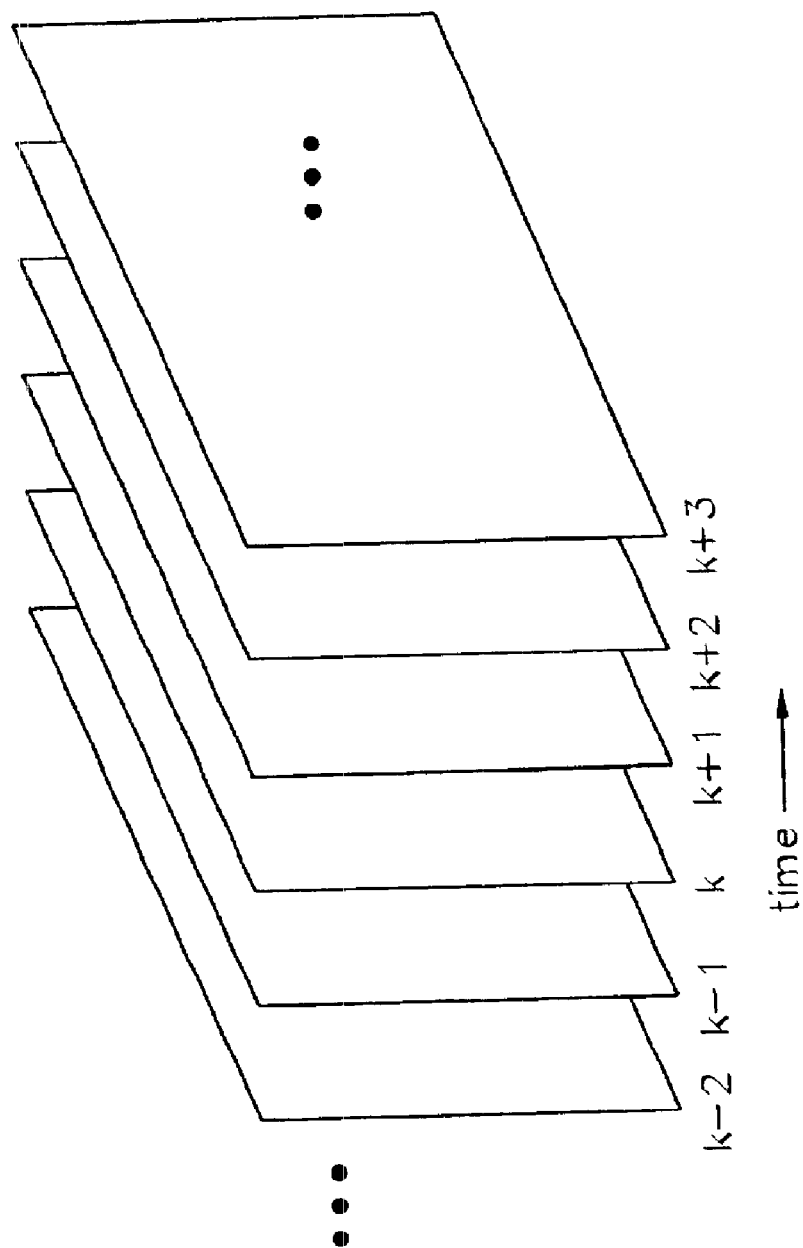
FIG. 2 illustrates a sequence of frames.

FIG. 2 illustrates a sequence of frames. A video sequence includes multiple video frames taken at intervals. The rate at which the frames are displayed is referred to as the frame rate. In addition to techniques used to compress still video, motion video techniques relate a frame at time k to a frame at time k-1 to further compress the video information into relatively small amounts of data. However, if the frame at time k-1 is not available due to an error, such as a transmission error, conventional video techniques may not be able to properly decode the frame at time k. As will be explained later, embodiments of the invention advantageously decode the video stream in a robust manner such that the frame at time k can be decoded even when the frame at time k-1 is not available.

The frames in a sequence of frames can correspond to either interlaced frames or to non-interlaced frames, i.e., progressive frames. In an interlaced frame, each frame is made of two separate fields, which are interlaced together to create the frame. No such interlacing is performed in a non-interlaced or progressive frame. While illustrated in the context of non-interlaced or progressive video, the skilled artisan will appreciate that the principles and advantages described herein are applicable to both interlaced video and non-interlaced video. In addition, while certain embodiments of the invention may be described only in the context of MPEG-2 or only in the context of MPEG-4, the principles and advantages described herein are applicable to a broad variety of video standards, including H.261, H.263, MPEG-2, and MPEG-4, as well as video standards yet to be developed. In addition, while certain embodiments of the invention may describe error concealment techniques in the context of, for example, a macroblock, the skilled practitioner will appreciate that the techniques described herein can apply to blocks, macroblocks, video object planes, lines, individual pixels, groups of pixels, and the like.

The MPEG-4 standard is defined in "Coding of Audio-Visual Objects: Systems," 14496-1, ISO/IEC JTC1/SC29/WG11 N2501, November 1998, and "Coding of Audio-Visual Objects: Visual," 14496-2, ISO/IEC JTC1/SC29/WG11 N2502, November 1998, and the MPEG-4 Video Verification Model is defined in ISO/IEC JTC 1/SC 29/WG 11, "MPEG-4 Video Verification Model 17.0," ISO/IEC JTC1/SC29/WG11 N3515, Beijing, China, July 2000, the contents of which are incorporated herein in their entirety.

In an MPEG-2 system, a frame is encoded into multiple blocks, and each block is encoded into six macroblocks. The macroblocks include information, such as luminance and color, for composing a frame. In addition, while a frame may be encoded as a still frame, i.e., an intra-coded frame, frames in a sequence of frames can be temporally related to each other, i.e., predictive-coded frames, and the macroblocks can relate a section of one frame at one time to a section of another frame at another time.

In an MPEG-4 system, a frame in a sequence of frames is further encoded into a number of video objects known as video object planes (VOPs). A frame can be encoded into a single VOP or in multiple VOPs. In one system, such as a wireless system, each frame includes only one VOP so that a VOP is a frame. The VOPs are transmitted to a receiver, where they are decoded by a decoder back into video objects for display. A VOP can correspond to an intra-coded VOP (I-VOP), to a predictive-coded VOP (P-VOP) to a bidirectionally-predictive coded VOP (B-VOP), or to a sprite VOP (S-VOP). An I-VOP is not dependent on information from another frame or picture, i.e., an I-VOP is independently decoded. When a frame consists entirely of I-VOPs, the frame is called an I-Frame. Such frames are commonly used in situations such as a scene change. Although the lack of dependence on content from another frame allows an I-VOP to be robustly transmitted and received, an I-VOP disadvantageously consumes a relatively large amount of data or data bandwidth as compared to a P-VOP or B-VOP. To efficiently compress and transmit video, many VOPs in video frames correspond to P-VOPs.

A P-VOP efficiently encodes a video object by referencing the video object to a past VOP, i.e., to a video object (encoded by a VOP) earlier in time. This past VOP is referred to as a reference VOP. For example, where an object in a frame at time k is related to an object in a frame at time k−1, motion compensation encoded in a P-VOP can be used to encode the video object with less information than with an I-VOP. The reference VOP can be either an I-VOP or a P-VOP.

A B-VOP uses both a past VOP and a future VOP as reference VOPs. In a real-time video bitstream, a B-VOP should not be used. However, the principles and advantages described herein can also apply to a video bitstream with B-VOPs. An S-VOP is used to display animated objects.

The encoded VOPs are organized into macroblocks. A macroblock includes sections for storing luminance (brightness) components and sections for storing chrominance (color) components. The macroblocks are transmitted and received via the communication network 120. It will be understood by one of ordinary skill in the art that the communication of the data can further include other communication layers, such as modulation to and demodulation from code division multiple access (CDMA). It will be understood by one of ordinary skill in the art that the video bitstream can also include corresponding audio information, which is also encoded and decoded.

Figure 3:
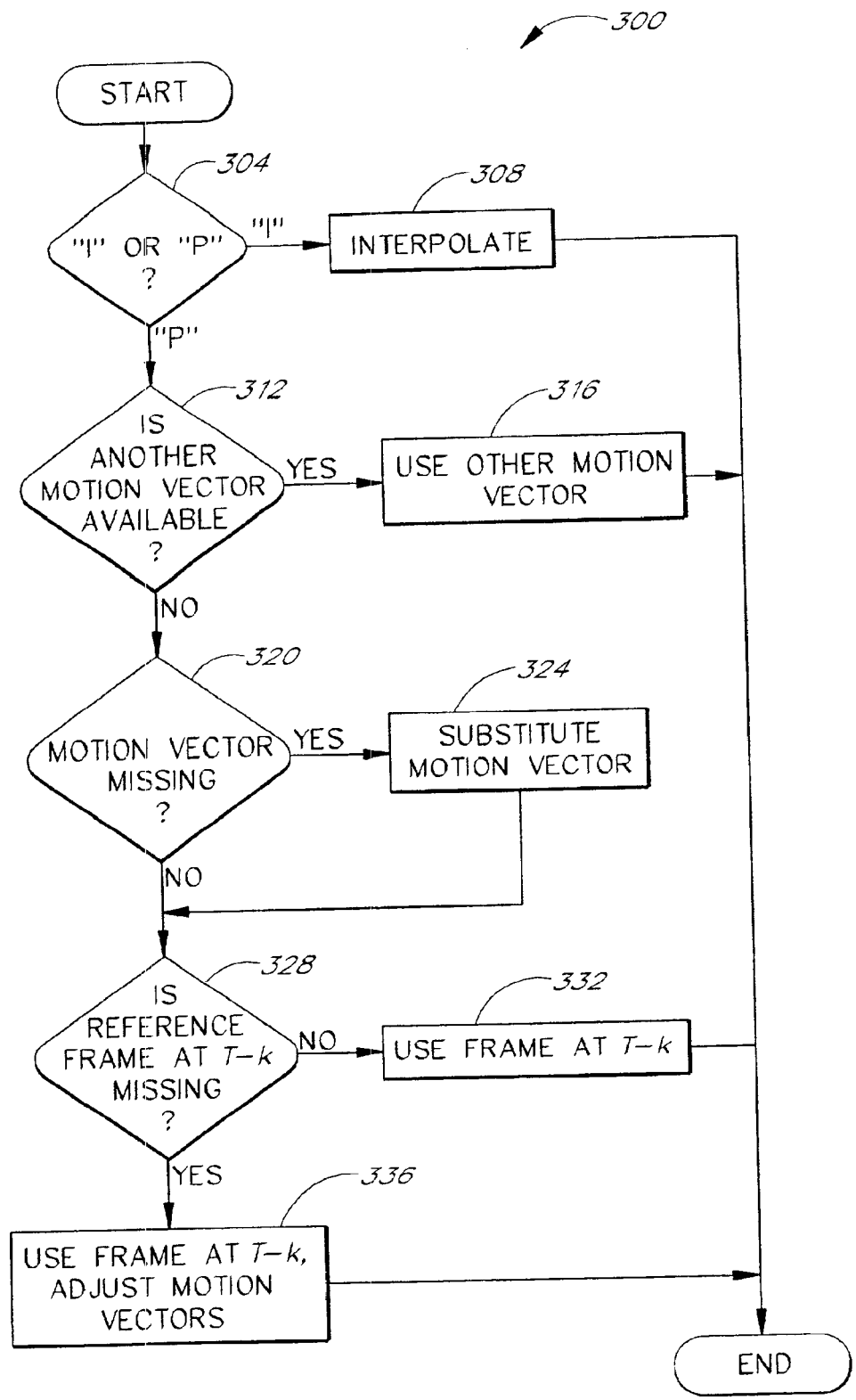
FIG. 3 is a flowchart generally illustrating a process of concealing errors or missing data in a video bitstream.

FIG. 3 is a flowchart 300 generally illustrating a process of concealing errors or missing data in a video bitstream. The errors can correspond to a variety of problems or unavailability including a loss of data, a corruption of data, a header error, a syntax error, a delay in receiving data, and the like. Advantageously, the process of FIG. 3 is relatively unsophisticated to implement and can be executed by relatively slow decoders.

Upon the detection of an error, the process starts at a first decision block 304. The first decision block 304 determines whether the error relates to intra-coding or predictive-coding. It will be understood by the skilled practitioner that the intra-coding or predictive-coding can refer to frames, to macroblocks, to video object planes (VOPs), and the like. While illustrated in the context of macroblocks, the skilled artisan will appreciate that the principles and advantages described in FIG. 3 also apply to video object planes and the like. The process proceeds from the first decision block 304 to a first state 308 when the error relates to an intra-coded macroblock. When the error relates to a predictive-coded macroblock, the process proceeds from the first decision block 304 to a second decision block 312. It will be understood that the error for a predictive-coded macroblock can arise from a missing macroblock in a present frame at time t, or from an error in a reference frame at time t−1 from which motion is referenced.

In the first state 308, the process interpolates or spatially conceals the error in the intra-coded macroblock, termed a missing macroblock. In one embodiment, the process conceals the error in the missing macroblock by linearly interpolating data from an upper macroblock that is intended to be displayed "above" the missing macroblock in the image, and from a lower macroblock that is intended to be displayed "below" the missing macroblock in the image. Techniques other than linear interpolation can also be used.

For example, the process can vertically linearly interpolate using a line denoted lb copied from the upper macroblock and a line denoted lt copied from the lower macroblock. In one embodiment, the process uses the lowermost line of the upper macroblock as lb and the topmost line of the lower macroblock as lt.

Depending on the circumstances, the upper macroblock and/or the lower macroblock may also not be available. For example, the upper macroblock and/or the lower macroblock may have an error. In addition, the missing macroblock may be located at the upper boundary of an image or at the lower boundary of the image.

One embodiment of the invention uses the following rules to conceal errors in the missing macroblock when linear interpolation between the upper macroblock and the lower macroblock is not applicable.

When the missing macroblock is at the upper boundary of the image, the topmost line of the lower macroblock is used as lb. If the lower macroblock is also missing, the topmost line of the next-lower macroblock in the image is used as lb, and so forth, if further lower macroblocks are missing. If all the lower macroblocks are missing, a gray line is used as lb.

When the missing macroblock is at the lower boundary of the image or the lower macroblock is missing, lb, the lowermost line of the upper macroblock, is also used as lt.

When the missing macroblock is neither at the upper boundary of the image nor at the lower boundary of the image, and interpolation between the upper macroblock and the lower macroblock is not applicable, one embodiment of the invention replaces the missing macroblock with gray pixels (Y=U=V=128 value).

According to one decoding standard, MPEG-4, pixels that are associated with a block with an error are stored as a "0," which corresponds to green pixels in a display. Gray pixels can be closer than green to the colors associated with a missing block, and simulation tests have observed a 0.1 dB improvement over the green pixels with relatively little or no increase in complexity. For example, the gray pixel color can be implemented by a copy instruction. When the spatial concealment is complete, the process ends.

When the error relates to a predictive-coded macroblock, the second decision block 312 determines whether another motion vector is available to be used for the missing macroblock. For example, the video bitstream may also include another motion vector, such as a redundant motion vector, which can be used instead of a standard motion vector in the missing macroblock. In one embodiment, a redundant motion vector is estimated by doubling the standard motion vector. One embodiment of the redundant motion vector references motion in the present frame at time t to a frame at time t−2. When both the frame at time t−2 and the redundant motion vector are available, the process proceeds from the second decision block 312 to a second state 316, where the process reconstructs the missing macroblock from the redundant motion vector and the frame at time t−2. Otherwise, the process proceeds from the second decision block 312 to a third decision block 320.

In the third decision block 320, the process determines whether the error is due to a predictive-coded macroblock missing in the present frame, i.e., missing motion vectors. When the motion vectors are missing, the process proceeds from the third decision block 320 to a third state 324. Otherwise, the process proceeds from the third decision block 320 to a fourth decision block 328.

In the third state 324, the process substitutes the missing motion vectors in the missing macroblock to provide temporal concealment of the error. One embodiment of temporal concealment of missing motion vectors is described in greater detail later in connection with FIG. 4. The process advances from the third state 324 to the fourth decision block 328.

In the fourth decision block 328, the process determines whether an error is due to a missing reference frame, e.g., the frame at time t−1. If the reference frame is available, the process proceeds from the fourth decision block 328 to a fourth state 332, where the process uses the reference frame and the substitute motion vectors from the third state 324. Otherwise, the process proceeds to a fifth state 336.

In the fifth state 336, the process uses a frame at time t−k as a reference frame. Where the frame corresponds to the previous-previous frame, k can equal 2. In one embodiment, the process multiplies the motion vectors that were received in the macroblock or substituted in the third state 324 by a factor, such as 2 for linear motion, to conceal the error. The skilled practitioner will appreciate that other appropriate factors may be used depending on the motion characteristics of the video images. The process proceeds to end until the next error is detected.

Figure 4:
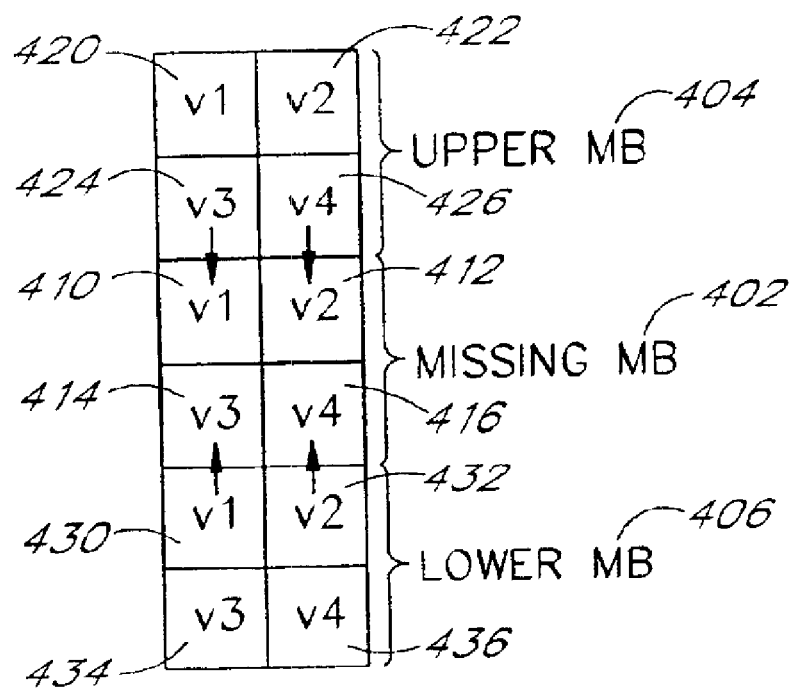
FIG. 4 illustrates a process of temporal concealment of missing motion vectors.

FIG. 4 illustrates an exemplary process of temporal concealment of missing motion vectors. In one embodiment, a macroblock includes four motion vectors. In the illustrated temporal concealment technique, the missing motion vectors of a missing macroblock 402 are substituted with motion vectors copied from other macroblocks. In another embodiment, which will be described later, the missing motion vectors of the missing macroblock 402 are substituted with motion vectors interpolated from other macroblocks.

When the missing macroblock 402 is below and above other macroblocks in the image, the process copies motion vectors from an upper macroblock 404, which is above the missing macroblock 402, and copies motion vectors from a lower macroblock 406, which is below the missing macroblock 402.

The missing macroblock 402 corresponds to a first missing motion vector 410, a second missing motion vector 412, a third missing motion vector 414, and a fourth missing motion vector 416. The upper macroblock 404 includes a first upper motion vector 420, a second upper motion vector 422, a third upper motion vector 424, and a fourth upper motion vector 426. The lower macroblock 406 includes a first lower motion vector 430, a second lower motion vector 432, a third lower motion vector 434, and a fourth lower motion vector 436.

When both the upper macroblock 404 and the lower macroblock 406 are available and include motion vectors, the illustrated process uses the third upper motion vector 424 as the first missing motion vector 410, the fourth upper motion vector 426 as the second missing motion vector 412, the first lower motion vector 430 as the third missing motion vector 414, and the second lower motion vector 432 as the fourth missing motion vector 416.

When the missing macroblock 402 at the upper boundary of the image, the process sets both the first missing motion vector 410 and the second missing motion vector 412 to the zero vector (no motion). The process uses the first lower motion vector 430 as the third missing motion vector 414, and the second lower motion vector 432 as the fourth missing motion vector 416.

When the lower macroblock 406 is corrupted or otherwise unavailable and/or the missing macroblock 402 is at the lower boundary of the image, the process sets the third missing motion vector 414 equal to the value used for the first missing motion vector 410, and the process sets the fourth missing motion vector 416 equal to the value used for the second missing motion vector 412.

In one embodiment, the missing motion vectors of the missing macroblock 402 are substituted with motion vectors interpolated from other macroblocks. A variety of techniques for interpolation exist. In one example, the first missing motion vector 410 is substituted with a vector sum of the first upper motion vector 420 and 3 times the third upper motion vector 424, i.e., $v1_{410}=v1_{420}+(3)(v3_{424})$. In another example, the third missing motion vector 414 can be substituted with a vector sum of the third lower motion vector 434 and 3 times the first lower motion vector 430, i.e., $v3_{414}=(3)(v1_{430})+v3_{434}$.

Figure 5:
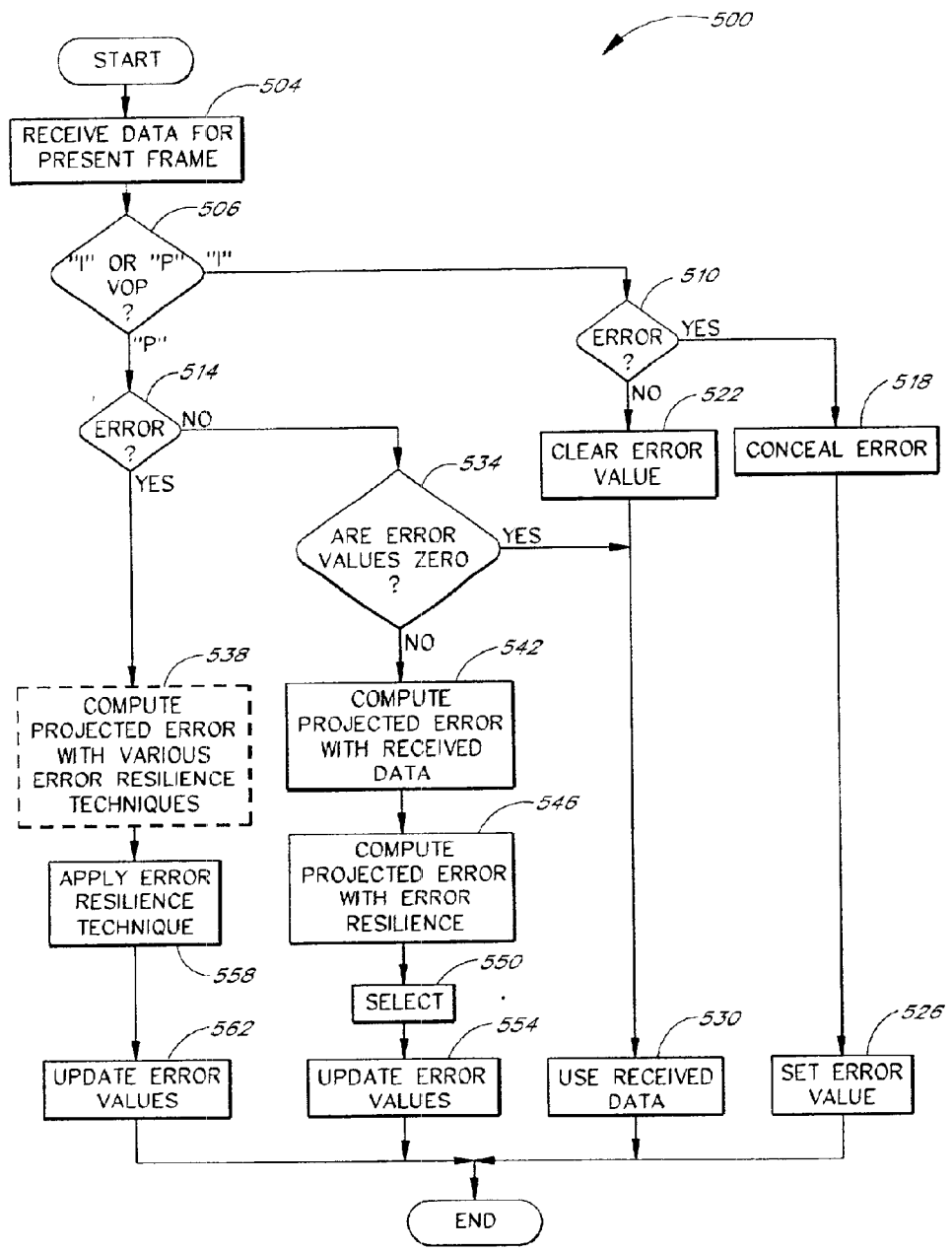
FIG. 5 is a flowchart generally illustrating a process of adaptively concealing errors in a video bitstream.

FIG. 5 is a flowchart 500 generally illustrating a process of adaptively concealing errors in a video bitstream. Advantageously, the process of FIG. 5 adaptively selects a concealment mode such that the error-concealed or reconstructed images can correspond to relatively less distorted image. Simulation tests predict improvements of up to about 1.5 decibels (dB) in peak signal to noise ratio. The process of FIG. 5 can be used to select an error concealment mode even when data for a present frame is received without an error.

For example, the process can receive three consecutive frames. A first frame is cleanly received. A second frame is received with a relatively high-degree of corruption. Data for a third frame is cleanly received, but reconstruction of a portion of the third frame depends on portions of the second frame, which was received with a relatively high-degree of corruption. Under certain conditions, it can be advantageous to conceal portion of the third frame because portions of the third frame depend on a portions of a corrupted frame. The process illustrated in FIG. 5 can advantageously identify when error concealment techniques should be invoked even when such error concealment techniques would not be needed by standard video decoders to provide a display of the corresponding image.

The process starts in a first state 504, where the process receives data from the video bitstream for the present frame, i.e., the frame at time t. A portion of the received data may be missing, due to an error, such as a dropout, corruption, delay, and the like. The process advances from the first state 504 to a first decision block 506.

In the first decision block 506, the process determines whether the data under analysis corresponds to an intra-coded video object plane (I-VOP) or to a predictive-coded VOP (P-VOP). It will be understood by one of ordinary skill in the art that the process can operate at different levels, such as on macroblocks or frames, and that a VOP can be a frame. The process proceeds from the first decision block 506 to a second decision block 510 when the VOP is an I-VOP. Otherwise, i.e., the VOP is a P-VOP, the process proceeds to a third decision block 514.

In the second decision block 510, the process determines whether there is an error in the received data for the I-VOP. The process proceeds from the second decision block 510 to a second state 518 when there is an error. Otherwise, the process proceeds to a third state 522.

In the second state 518, the process conceals the error with spatial concealment techniques, such as the spatial concealment techniques described earlier in connection with the first state 308 of FIG. 3. The process advances from the second state 518 to a fourth state 526.

In the fourth state 526, the process sets an error value to an error predicted for the concealment technique used in the second state 518. One embodiment normalizes the error to a range between 0 and 255, where 0 corresponds to no error, and 255 corresponds to a maximum error. For example, where gray pixels replace a pixel in an error concealment mode, the error value can correspond to 255. In one embodiment, the error value is retrieved from a table of pre-calculated error estimates. In spatial interpolation, the pixels adjacent to error-free pixels are typically more faithfully concealed than the pixels that are farther away from the error-free pixels. In one embodiment, an error value is modeled as 97 for pixels adjacent to error-free pixels, while other pixels are modeled with an error value of 215. The error values can be maintained in a memory array on a per-pixel basis, can be maintained for only a selection of pixels, can be maintained for groups of pixels, and so forth.

In the third state 522, the process has received an error-free I-VOP and clears (to zero) the error value for the corresponding pixels of the VOP. Of course, other values can be arbitrarily selected to indicate an error-free state. The process advances from the third state 522 to a fifth state 530, where the process constructs the VOP from the received data and ends. The process can be reactivated to process the next VOP received.

Returning to the third decision block 514, the process determines whether the P-VOP includes an error. When there is an error, the process proceeds from the third decision block 514 to a fourth decision block 534. Otherwise, the process proceeds to an optional sixth state 538.

In the fourth decision block 534, the process determines whether the error values for the corresponding pixels are zero or not. If the error values are zero and there is no error in the data of the present P-VOP, then the process proceeds to the fifth state 520 and constructs the VOP with the received data as this corresponds to an error-free condition. The process then ends or waits for the next VOP to be processed. If the error values are non-zero, then the process proceeds to a seventh state 542.

In the seventh state 542, the process projects the estimate error value, i.e., a new error value, that would result if the process uses the received data. For example, if a previous frame contained an error, that error may propagate to the present frame by decoding and using the P-VOP of the present frame. In one embodiment, the estimated error value is about 103 plus an error propagation term, which depends on the previous error value. The error propagation term can also include a "leaky" value, such as 0.93, to reflect a slight loss in error propagation per frame. The process advances from the seventh state 542 to an eighth state 546.

In the eighth state 546, the process projects the estimated error value that would result if the process used an error resilience technique. The error resilience technique can correspond to a wide variety of techniques, such as an error concealment technique described in connection with FIGS. 3 and 4, the use of additional motion vectors that reference other frames, and the like. Where the additional motion vector references the previous-previous frame, one embodiment uses an error value of 46 plus the propagated error. It will be recognized that a propagated error in a previous frame can be different than a propagated error in a previous-previous frame. In one embodiment, the process projects the estimated error values that would result from a plurality of error resilience techniques. The process advances from the eighth state 546 to a ninth state 550.

In the ninth state 550, the process selects between using the received data and using an error resilience technique. In one embodiment, the process selects between using the received data and using one of multiple error resilience techniques. The construction, concealment, or reconstruction technique that provides the lowest projected estimated error value is used to construct the corresponding portion of the image. The process advances from the ninth state 550 to a tenth state 554, where the process updates the affected error values according to the selected received data or error resilience technique used to generate the frame, and the process ends. It will be understood that the process can then wait until the next VOP is received, and the process can reactivate to process the next VOP.

In the optional sixth state 538, the process computes the projected error values with multiple error resilience techniques. The error resilience technique that indicates the lowest projected estimated error value is selected. The process advances from the optional sixth state 538 to an eleventh state 558.

In the eleventh state 558, the process applies the error resilience technique selected in the optional sixth state 538.

Where the process uses only one error resilience technique to conceal errors for P-VOPs, the skilled practitioner will appreciate that the optional sixth state 538 need not be present, and the process can apply the error resilience technique in the eleventh state 558 without a selection process. The process advances from the from the eleventh state 558 to a twelfth state 562, where the process updates the corresponding error values in accordance with the error resilience technique applied in the eleventh state 558. The process then ends and can be reactivated to process future VOPs.

FIG. 6 is a flowchart 600 generally illustrating a process that can use weighted predictions to compensate for errors in a video bitstream. One embodiment of the process is relatively less complex to implement than adaptive techniques. The illustrated process receives a frame of data and processes the data one macroblock at a time. It will be understood that when errors in transmission arise, the process may not receive an entire frame of data. Rather, the process can start processing the present frame upon other conditions, such as determining that the timeframe for receiving the frame has expired, or receiving data for the subsequent frame, and the like.

The process starts in a first decision block 604, where the process determines whether the present frame is a predictive-coded frame (P-frame) or is an intra-coded frame (I-frame). The process proceeds from the first decision block 604 to a second decision block 608 when the present frame corresponds to an I-frame. When the present frame corresponds to a P-frame, the process proceeds from the first decision block 604 to a third decision block 612.

In the second decision block 608, the process determines whether the macroblock under analysis includes an error. The macroblock under analysis can correspond to the first macroblock of the frame and end with the last macroblock of the frame. However, the order of analysis can vary. The error can correspond to a variety of anomalies, such as missing data, syntax errors, checksum errors, and the like. The process proceeds from the second decision block 608 to a first state 616 when no error is detected in the macroblock. If an error is detected in the macroblock, the process proceeds to a second state 620.

In the first state 616, the process decodes the macroblock. All macroblocks of an intra-coded frame are intra-coded. An intra-coded macroblock can be decoded without reference to other macroblocks. The process advances from the first state 616 to a third state 624, where the process resets an error variance (EV) value corresponding to a pixel in the macroblock to zero. The error variance relates to a predicted or expected amount of error propagation. Since the intra-coded macroblock does not depend on other macroblocks, an error-free intra-coded macroblock can be expected to have an error variance of zero. It will be understood by one of ordinary skill in the art that any number can be arbitrarily selected to represent zero. It will also be understood that the error variance can be tracked in a broad variety of ways, including on a per pixel basis, on groups of pixels, on selected pixels, per macroblock, and the like. The process advances from the third state 624 to a fourth decision block 628.

In the fourth decision block 628, the process determines whether it has processed the last macroblock in the frame. The process returns from the fourth decision block 628 to the second decision block 608 when there are further macroblocks in the frame to be processed. When the last macroblock has been processed, the process ends and can be reactivated when for the subsequent frame.

In the second state 620, the process conceals the error with spatial concealment techniques, such as the spatial concealment techniques described earlier in connection with the first state 308 of FIG. 3. In one embodiment, the process fills the pixels of the macroblock with gray, which is encoded as 128. The process advances from the second state 620 to a fourth state 632, where the process sets the macroblock's corresponding error variance, $\sigma_H^2$, to a predetermined value, $\sigma_{HT}^2$. In one embodiment, the error variance, $\sigma_H^2$, is normalized to a range between 0 and 255. The predetermined value can be obtained by, for example, simulation results, real world testing, and the like. In addition, the predetermined value can depend on the concealment technique. In one embodiment, where the concealment technique is to fill the macroblock with gray, the predetermined value, $\sigma_{HT}^2$, is 255. The process advances from the fourth state 632 to the fourth decision block 628.

When the frame is a P-frame, the process proceeds from the first decision block 604 to the third decision block 612. In the third decision block 612, the process determines whether the macroblock under analysis includes an error. The process proceeds from the third decision block 612 to a fifth decision block 636 when no error is detected. When an error is detected, the process proceeds from the third decision block 612 to a fifth state 640.

A macroblock in a P-frame can correspond to either an inter-coded macroblock or to an intra-coded macroblock. In the fifth decision block 636, the process determines whether the macroblock corresponds to an inter-coded macroblock or to an intra-coded macroblock. The process proceeds from the fifth decision block 636 to a sixth state 644 when the macroblock corresponds to an intra-coded macroblock. When the macroblock corresponds to an inter-coded macroblock, the process proceeds to a seventh state 648.

In the sixth state 644, the process proceeds to decode the intra-coded macroblock that was received without an error. The intra-coded macroblock can be decoded without reference to another macroblock. The process advances from the sixth state 644 to an eighth state 652, where the process resets the corresponding error variances maintained for the macroblock to zero. The process advances from the eighth state 652 to a sixth decision block 664.

In the sixth decision block 664, the process determines whether it has processed the last macroblock in the frame. The process returns from the sixth decision block 664 to the third decision block 612 when there are further macroblocks in the frame to be processed. When the last macroblock has been processed, the process ends and can be reactivated for the subsequent frame.

In the seventh state 648, the process reconstructs the pixels of the macroblock even when the macroblock was received without error. Reconstruction in this circumstance can improve image quality because a previous-previous frame may exhibit less corruption than a previous-frame. One embodiment of the process selects between a first reconstruction mode and a second reconstruction mode depending on which mode is expected to provide better error concealment. In another embodiment, weighted sums are used to combine the two modes. In one example, the weights used correspond to the inverse of estimated errors so that the process decodes with minimal mean squared error (MMSE).

In the first reconstruction mode, the process reconstructs the macroblock based on the received motion vector and the corresponding portion in the previous frame. The reconstructed pixel, $\hat{q}_k$, as reconstructed by the first reconstruction mode, is expressed in Equation 1. In Equation 1, $\hat{r}_k$ is a prediction residual.

$$\hat{q}_k = \hat{p}_{k-1} + \hat{r}_k \quad \text{(Eq. 1)}$$

In the second reconstruction mode, the process reconstructs the macroblock by doubling the amount of motion specified by the motion vectors of the macroblock, and the process uses a corresponding portion of the previous-previous frame, i.e., the frame at time k−2.

The error variance of a pixel reconstructed by the first reconstruction mode, $\sigma_{Pk-1}^2$, is expressed in Equation 2, where k indicates the frame, e.g., k=0 for the present frame. The error variance of a pixel reconstructed by the second reconstruction mode, $\sigma_{Pk-2}^2$, is expressed in Equation 3.

$$\sigma_{P_{k-1}}^2 = E\{(\hat{P}_{k-1} - \tilde{P}_{k-1})^2\} \quad \text{(Eq. 2)}$$

$$\begin{aligned}\sigma_{P_{k-2}}^2 &= E\{(\hat{p}_{k-1} - \tilde{p}_{k-2})^2\} \quad \text{(Eq. 3)} \\ &\cong E\{(\hat{p}_{k-1} - \hat{p}_{k-2})^2\} + E(\hat{p}_{k-1} - \tilde{p}_{k-2})^2 \\ &= \sigma_{H\Theta}^2 + \sigma_{P_{k-2}}^2\end{aligned}$$

In one embodiment, the process selects the second reconstruction mode when $\sigma_{Pk-1}^2 > \sigma_{H\Theta}^2 + \sigma_{Pk-2}^2$. In another embodiment, weighted sums are used to combine the reconstruction techniques. In one example, the weights used correspond to the inverse of predicted errors so that the process decodes with minimal mean squared error (MMSE). With weighted sums, the process combines the two predictions to reconstruct the pixel, $q_k$. In one embodiment, the pixel $q_k$ is reconstructed by $\hat{q}_k$, as expressed in Equation 4.

$$\tilde{q}_k = \beta \tilde{P}_{k-1} + (1-\beta)\tilde{P}_{k-2} + \hat{r}_k \quad \text{(Eq. 4)}$$

In one embodiment, the weighting coefficient, β, is calculated from Equation 5.

$$\beta = \frac{\sigma_{H\Theta}^2 + \sigma_{P_{k-2}}^2}{\sigma_{H\Theta}^2 + \sigma_{P_{k-1}}^2 + \sigma_{P_{k-2}}^2} \quad \text{(Eq. 5)}$$

The process advances from the seventh state 648 to a ninth state 656. In the ninth state 656, the process updates the corresponding error variances for the macroblock based on the reconstruction applied in the seventh state 648. The process advances from the from the ninth state 656 to the sixth decision block 664. In one embodiment, the error variance is calculated from expression in Equation 6.

$$\sigma_{q_k}^2 = \frac{\sigma_{P_{k-1}}^2 (\sigma_{H\Theta}^2 + \sigma_{P_{k-2}}^2)}{\sigma_{H\Theta}^2 + \sigma_{P_{k-1}}^2 + \sigma_{P_{k-2}}^2} \quad \text{(Eq. 6)}$$

In the fifth state 640, the process conceals the errors in the macroblock. A variety of concealment techniques can be applied. In one embodiment, the process uses temporal concealment, regardless of whether the macroblock is intra-coded or inter-coded. It will be understood that in other embodiments, the type of coding used in the macroblock can be used as a factor in the selection of a concealment technique.

One embodiment of the process selects between a first concealment mode based on a previous frame and a second concealment mode based on a previous-previous frame in the fifth state 640. In the first concealment mode, the process generates an inter-coded macroblock for the missing macroblock using the motion vectors extracted from a macroblock that is above the missing macroblock in the image. If the macroblock that is above the missing macroblock has an error, the motion vectors can be set to zero vectors. The corresponding portion of the frame is reconstructed with the generated inter-coded macroblock and the corresponding reference information from the previous frame, i.e., the frame at t−1.

In the second concealment mode, the process generates an inter-coded macroblock for the missing macroblock by copying and multiplying by 2 the motion vectors extracted from a macroblock that is above the missing macroblock in the image. If the macroblock above the missing macroblock has an error, the motion vectors can be set to zero vectors. The corresponding portion of the frame is reconstructed with the generated inter-coded macroblock and the corresponding reference information from the previous-previous frame, i.e., the frame at t−2.

The error variance can be modeled as a sum of the associated propagation error and concealment error. In one embodiment, the first concealment mode has a lower concealment error than the second concealment mode, but the second concealment mode has a lower propagation error than the first concealment mode.

In one embodiment, the process selects between the first concealment mode and the second concealment mode based on which one provides a lower estimated error variance. In another embodiment, weighted sums are used to combine the two modes. In Equation 7, $\sigma_{q_{k(i)}}^2$, denotes the error variance of a pixel $q_k$. The value of i is equal to 1 for the first concealment mode based on the previous frame and is equal to 2 for the second concealment mode based on the previous-previous frame.

$$\begin{aligned}\sigma_{q_{k(i)}}^2 &= E\{(\hat{q}_k - \hat{c}_{k-i})^2\} \quad \text{(Eq. 7)} \\ &\cong E\{(\hat{q}_k - \hat{c}_{k-i})^2\} + E\{(\hat{c}_{k-1} - \tilde{c}_{k-i})^2\} \\ &= \sigma_{H\Delta(i)}^2 + \sigma_{c_{k-1}}^2\end{aligned}$$

In Equation 7, $\sigma_{H\Delta(i)}^2$ corresponds to the error variance for the concealment mode and $\sigma_{c_{k-1}}^2$ corresponds to the propagation error variance.

In another embodiment, the process computes weighted sums to further reduce the error variance of the concealment. For example, $\hat{q}_k$ can be replaced by $\tilde{q}_k$ as shown in Equation 8.

$$\tilde{q}_k = \alpha \tilde{c}_{k-1} + (1-\alpha)\tilde{c}_{k-2} \quad \text{(Eq. 8)}$$

In one embodiment, the weighting coefficient, α, is as expressed in Equation 9.

$$\alpha = \frac{\sigma_{q_{k(2)}}^2}{\sigma_{q_{k(1)}}^2 + \sigma_{q_{k(2)}}^2} \quad \text{(Eq. 9)}$$

The process advances from the fifth state to a tenth state 660. In the tenth state 660, the process updates the corresponding error variances for the macroblock based on the concealment applied in the fifth state 640, and the process advances to the sixth decision block 664. In one embodiment with weighted sums, the error variance is calculated from expression in Equation 10.

$$\sigma_{q_k}^2 = E\{(\hat{q}_k - \tilde{q}_k)^2\} = \frac{\sigma_{q_{k(1)}}^2 \cdot \sigma_{q_{k(2)}}^2}{\sigma_{q_{k(1)}}^2 + \sigma_{q_{k(2)}}^2} \quad \text{(Eq. 10)}$$

In some situations, an entire frame is dropped or lost. One embodiment of the invention advantageously repeats the previous frame, or interpolates between the previous frame and the next frame, in response to a detection of a frame that is missing from a frame sequence. In a real-time application, the display of the sequence of frames can be slightly delayed to allow the decoder time to receive the next frame, to decode the next frame, and to generate the interpolated replacement frame from the previous frame and the next frame. The missing frame can be detected by calculating a frame rate from received frames and by calculating an expected time to receive a subsequent frame. When a frame does not arrive at the expected time, it is replaced with the previous frame or interpolated from the previous and next frames. One embodiment of the process further resynchronizes the available audio portion to correspond with the displayed images.

Data corruption is an occasionally unavoidable occurrence. Various techniques can help conceal errors in the transmission or reception of video data. However, standard video decoding techniques can inefficiently declare error-free data as erroneous. For example, the MPEG-4 standard recommends dumping an entire macroblock when an error is detected in the macroblock. The following techniques illustrate that data for some macroblocks can be reliably recovered and used from video packets with corruption. For example, a macroblock in an MPEG-4 system can contain six 8-by-8 image blocks. Four of the image blocks encode luminosity, and two of the image blocks encode chromaticity. In one conventional system, all six of the image blocks are discarded even if a transmission error were only to affect one image block.

Figure 7A:
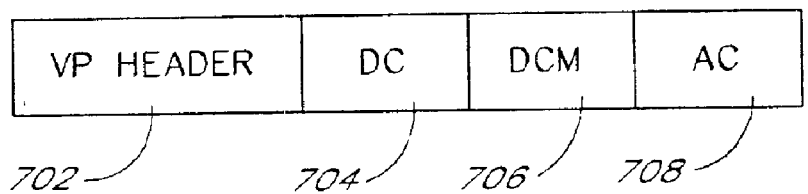
FIG. 7A illustrates a sample of a video packet with DC and AC components for an I-VOP.
Figure 7B:
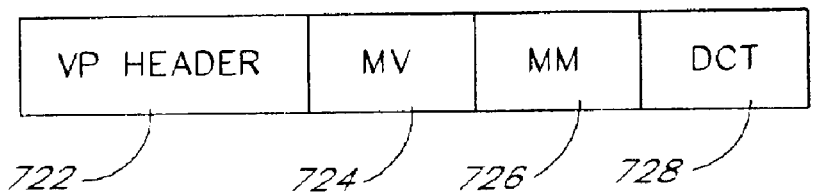
FIG. 7B illustrates a video packet for a P-VOP.

FIGS. 7A and 7B illustrate sample video packets. In an MPEG-4 system, video packets include resynchronization markers to indicate the start of a video packet. The number of macroblocks within a video packet can vary.

FIG. 7A illustrates a sample of a video packet 700 with DC and AC components for an I-VOP. The video packet 700 includes a video packet header 702, which includes the resynchronization marker and other header information that can be used to decode the macroblocks of the packet, such as the macroblock number of the first macroblock in the packet and the quantization parameter (QP) to decode the packet. A DC portion 704 can include mcbpc, dquant, and dc data, such as luminosity. A DC marker 706 separates the DC portion 704 from an AC portion 708. In one embodiment, the DC marker 706 is a 19-bit binary string "110 1011 0000 0000 0001." The AC portion 708 can include an ac_pred flag and other textual information.

FIG. 7B illustrates a video packet 720 for a P-VOP. The video packet 720 includes a video packet header 722 similar to the video packet header 702 of FIG. 7A. The video packet 720 further includes a motion vector portion 724, which includes motion data. A motion marker 726 separates the motion data in the motion vector portion 724 from texture data in a DCT portion 728. In one embodiment, the motion marker is a 17-bit binary string "1 1111 0000 0000 0001."

Figure 8:
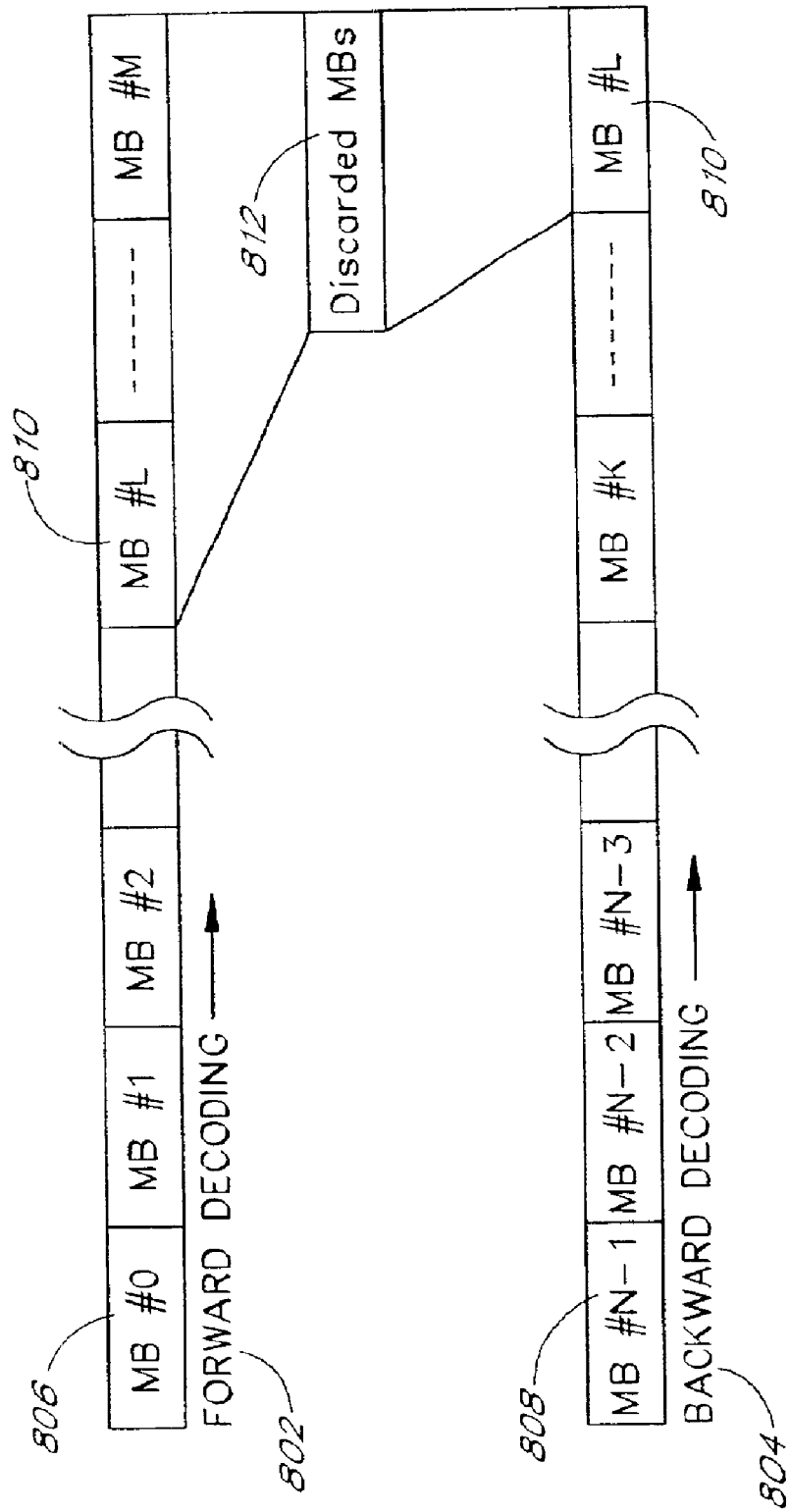
FIG. 8 illustrates an example of discarding a corrupted macroblock.

FIG. 8 illustrates an example of discarding a corrupted macroblock. Reversible variable length codes (RVLC) are designed to allow data, such as texture codes, to be read or decoded in both a forward direction 802 and a reverse or backward direction 804. For example, in the forward direction 802 with N macroblocks, a first macroblock 806, MB #0, is read first and a last macroblock 808, MB # N–1, is read last. An error can be located in a macroblock 810, which can be used to define a range of macroblocks 812 that are discarded.

Figure 9:
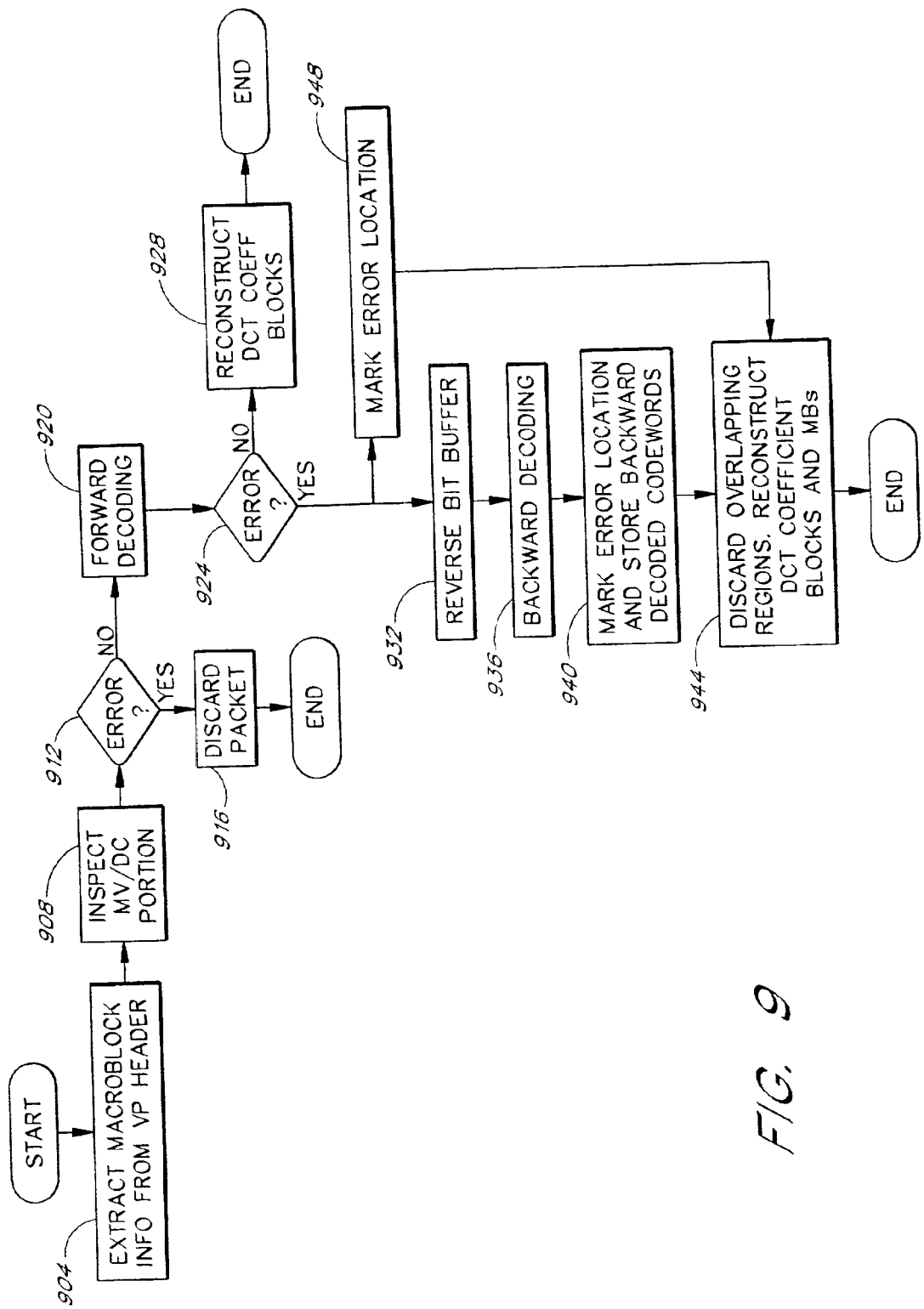
FIG. 9 is a flowchart that generally illustrates a process according to an embodiment of the invention of partial RVLC decoding of discrete cosine transform (DCT) portions of corrupted packets

FIG. 9 is a flowchart that generally illustrates a process according to an embodiment of the invention of partial RVLC decoding of discrete cosine transform (DCT) portions of corrupted packets. The process starts at a first state 904 by reading macroblock information, such as the macroblock number, of the video packet header of the video packet. The process advances from the first state 904 to a second state 908.

In the second state 908, the process inspects the DC portion or the motion vector portion of the video packet, as applicable. The process applies syntactic and logic tests to the video packet header and to the DC portion or motion vector portion to detect errors therein. The process advances from the second state 908 to a first decision block 912.

In the first decision block 912, the exemplary process determines whether there was an error in the video packet header from the first state 904 or the DC portion or motion vector portion from the second state 908. The first decision block 912 proceeds to a third state 916 when the error is detected. When the error is not detected, the process proceeds from the first decision block 912 to a fourth state 920.

In the third state 916, the process discards the video packet. It will be understood by one of ordinary skill in the art that errors in the video packet header or in the DC portion or motion vector portion can lead to relatively severe errors if incorrectly decoded. In one embodiment, error concealment techniques are instead invoked, and the process ends. The process can be reactivated later to read another video packet.

In the fourth state 920, the process decodes the video packet in the forward direction. In one embodiment, the process decodes the video packet according to standard MPEG-4 RVLC decoding techniques. One embodiment of the process maintains a count of macroblocks in a macroblocks counter. The header at the beginning of the video packet includes a macroblock index, which can be used to initialize the macroblocks counter. As decoding proceeds in the forward direction, the macroblock counter increments. When an error is encountered, one embodiment removes one count from the macroblocks counter such that the macroblock counter contains the number of completely decoded macroblocks.

In addition, one embodiment of the process stores all codewords as leaves of a binary tree. Branches of the binary tree are labeled with either a 0 or a 1. One embodiment of the process uses two different tree formats depending on whether the macroblock is intra or inter coded. When decoding in the forward direction, bits from the video packet are retrieved from a bit buffer containing the RVLC data, and the process traverses the data in the tree until one of 3 events is encountered. These events correspond to a first event where a valid codeword is reached at a leaf-node; a second event where an invalid leaf of the binary tree (not corresponding to any RVLC codeword) is reached; and a third event where the end of the bit buffer is reached.

The first event indicates no error. With no error, a valid RVLC codeword is mapped, such as via a simple lookup table, to its corresponding leaf-node (last, run, level). In one embodiment, this information is stored in an array. When an entire 8-by-8 block is decoded, as indicated by the presence of an RVLC codeword with last=1, the process proceeds to decode the next block until an error is encountered or the last block is reached.

The second event and the third event correspond to errors. These errors can be caused by a variety of error conditions. Examples of error conditions include an invalid RVLC codeword, such as wrong marker bits in the expected locations of ESCAPE symbols; decoded codeword from an ESCAPE symbol results in (run, length, level) information that should have been encoded by a regular (non-ESCAPE) symbol; more than 64 (or 63 for the case of Intra-blocks with DC coded separately from AC) DCT coefficients in an 8-by-8 block; extra bits remaining after successfully decoding all expected DCT coefficients of all 8-by-8 blocks in a video packet; and insufficient bits to decode all expected 8-by-8 blocks in video packet. These conditions can be tested sequentially. For example, when testing for extra bits remaining, the condition is tested after all the 8-by-8 blocks in the video packet are processed. In another example, the testing of the number of DCT coefficients can be performed on a block-by-block basis. The process advances from the fourth state 920 to a second decision block 924. However, it will be understood by the skilled practitioner that the fourth state 920 and the second decision block 924 can be included in a loop, such as a FOR loop.

In the second decision block 924, the process determines whether there has been an error in the forward decoding of the video packet as described in the fourth state 920 (in the forward direction). The process proceeds from the second decision block 924 to a fifth state 928 when there is no error. If there is an error in the forward decoding, the process proceeds from the second decision block 924 to a sixth state 932 and to a tenth state 948. Upon an error in forward decoding, the process terminates further forward decoding and records the error location and type of error in the tenth state 948. The error location in the forward direction, $L_1$, and the number of completely decoded macroblocks in the forward direction, $N_1$, will be described in greater detail later in connection with FIGS. 10–13.

In the fifth state 928, the process reconstructs the DCT coefficient blocks and ends. In one embodiment, the reconstruction proceeds according to standard MPEG-4 techniques. It will be understood by one of ordinary skill in the art that the process can be reactivated to process the next video packet.

In the sixth state 932, the process loads the video packet data to a bit buffer. In order to perform partial RVLC decoding, detection of the DC (for I-VOP) or Motion (for P-VOP) markers for each video packet should be obtained without prior syntax errors or data overrun. In one embodiment, a circular buffer that reads data for the entire packet is used to obtain the remaining bits for a video packet by unpacking each byte to 8 bits.

The process removes stuffing bits from the end of the buffer, which leaves only data bits in the RVLC buffer. During parsing of the video packet header and motion vector portion or DC portion of the video packet, the expected number of macroblocks, the type of each one macroblock (INTRA or INTER), whether a macroblock is skipped or not, how many and which of the expected 4 luminance and 2 chrominance 8-by-8 blocks have been coded and should thus be present in the bitstream, and whether INTRA blocks have 63 or 64 coefficients (i.e., whether their DC coefficient is coded together or separate from the AC coefficients) should be known. This information can be stored in a data structure with the RVLC data bits. The process advances from the sixth state 932 to a seventh state 936.

In the seventh state 936, the process performs reversible variable length code (RVLC) decoding in the backward direction on the video packet. In one embodiment, the process performs the backward decoding on the video packet according to standard MPEG-4 RVLC decoding techniques. The maximum number of decoded codewords should be recovered in each direction. One embodiment of the process maintains the number of completely decoded macroblocks encountered in the reverse direction in a counter. In one embodiment, the counter is initialized with a value from the video packet header that relates to the number of macroblocks expected in the video packet, N, and the counter counts down as macroblocks are read. The process advances from the seventh state 936 to an eighth state 940.

In the eighth state 940, the process detects an error in the video packet from the backward decoding and records the error and the type of error. In addition to the errors for the forward direction described earlier in connection with the fourth state 920, another error that can occur in the reverse decoding direction occurs when the last decoded codeword, i.e., the first codeword in the reverse direction, decodes to a codeword with last=0. Advantageously, detection of the location of the error in the reverse direction can reveal ranges of data where such data is still usable. Use of the error location in the reverse or backward direction, $L_2$, and use of the number of completely decoded macroblocks in the reverse direction, $N_2$, will be described later in connection with FIGS. 10–13.

In the exemplary process, different decoding trees (INTRA/INTER) are used for reverse decoding direction than in the forward decoding direction. In one embodiment, the reverse decoding trees are obtained by reversing the order of bits for each codeword. In addition, one embodiment modifies the symbol decoding routine to take into account that a sign bit that is coming last in forward decoding is encountered first in backward decoding; and that Last=1 indicates the last codeword of an 8-by-8 block in forward decoding, but indicates the first codeword in reverse decoding. When decoding in the reverse direction, the very first codeword should have last=1 or otherwise an error is declared.

When data is read in the reverse order, the process looks ahead by one symbol when decoding a block. If a codeword with last=1 is reached, the process has reached the end of reverse decoding of the current 8-by-8 block, and the process advances to the next block. In addition, the order of the blocks is reversed for the same reason. For example, if 5 INTER blocks followed by 3 INTRA blocks are expected in the forward direction, 3 INTRA blocks followed by 5 INTER blocks should be expected in the reverse direction. The process advances from the eighth state 940 to a ninth state 944.

In the ninth state 944, the process discards overlapping error regions from the forward and the reverse decoding directions. The 2 arrays of decoded symbols are compared to evaluate overlap in error between the error obtained during forward RVLC decoding and the error obtained during reverse RVLC decoding to partially decode the video packet. Further details of partial decoding will be described in greater detail later in connection with FIGS. 10–13. It will be understood by one of ordinary skill in the art that that in the process described herein, the arrays contain the successfully decoded codewords before any decoding error has been declared in each direction. If there is no overlap between successfully decoded regions in forward and reverse direction at the bit-level and also at the DCT (Macroblock) level, then one embodiment performs a conservative backtracking of a predetermined number of bits, T, such as about 90 bits in each direction, i.e., the last 90 bits in each direction are discarded. Those codewords that overlap (in the bit buffer) or decode to DCT coefficients that overlap (in the DCT buffer) are discarded. In addition, one embodiment retains only entire INTER macroblocks (no partial macroblock DCT data or Intra-coded macroblocks) in the decoding buffers. The remaining codewords are then used to reconstruct the 8-by-8 DCT values for individual blocks, and the process ends. It will be understood that the process can be reactivated to process the next video packet.

The process illustrated in FIG. 9 reveals the location of the error (the bit location) in the forward direction, $L_1$; the location of the error in the reverse direction, $L_2$; the type of error that was encountered in the forward direction and in the reverse direction; the expected length of the video packet, L; the number of expected macroblocks in the video packet, N, the number of completely decoded macroblocks in the forward direction, $N_1$; and the number of completely decoded macroblocks in the reverse direction, $N_2$.

FIGS. 10–13 illustrate partial RVLC decoding strategies. In one exemplary partial RVLC decoding process, a partial decoding strategy for extraction of useful data from a video packet is selected according to one of four outcomes. Processing of a first outcome, where $L_1+L_2<L$, and $N_1+N_2<N$, will be described later in connection with FIG. 10. Processing of a second outcome, where $L_1+L_2<L$, and $N_1+N_2>=N$, will be described later in connection with FIG. 11. Processing of a third outcome, where $L_1+L_2>=L$, and $N_1+N_2<N$, will be described later in connection with FIG. 12. Processing of a fourth outcome, where $L_1+L_2>=L$, and $N_1+N_2>=N$, will be described later in connection with FIG. 13.

Figure 10:
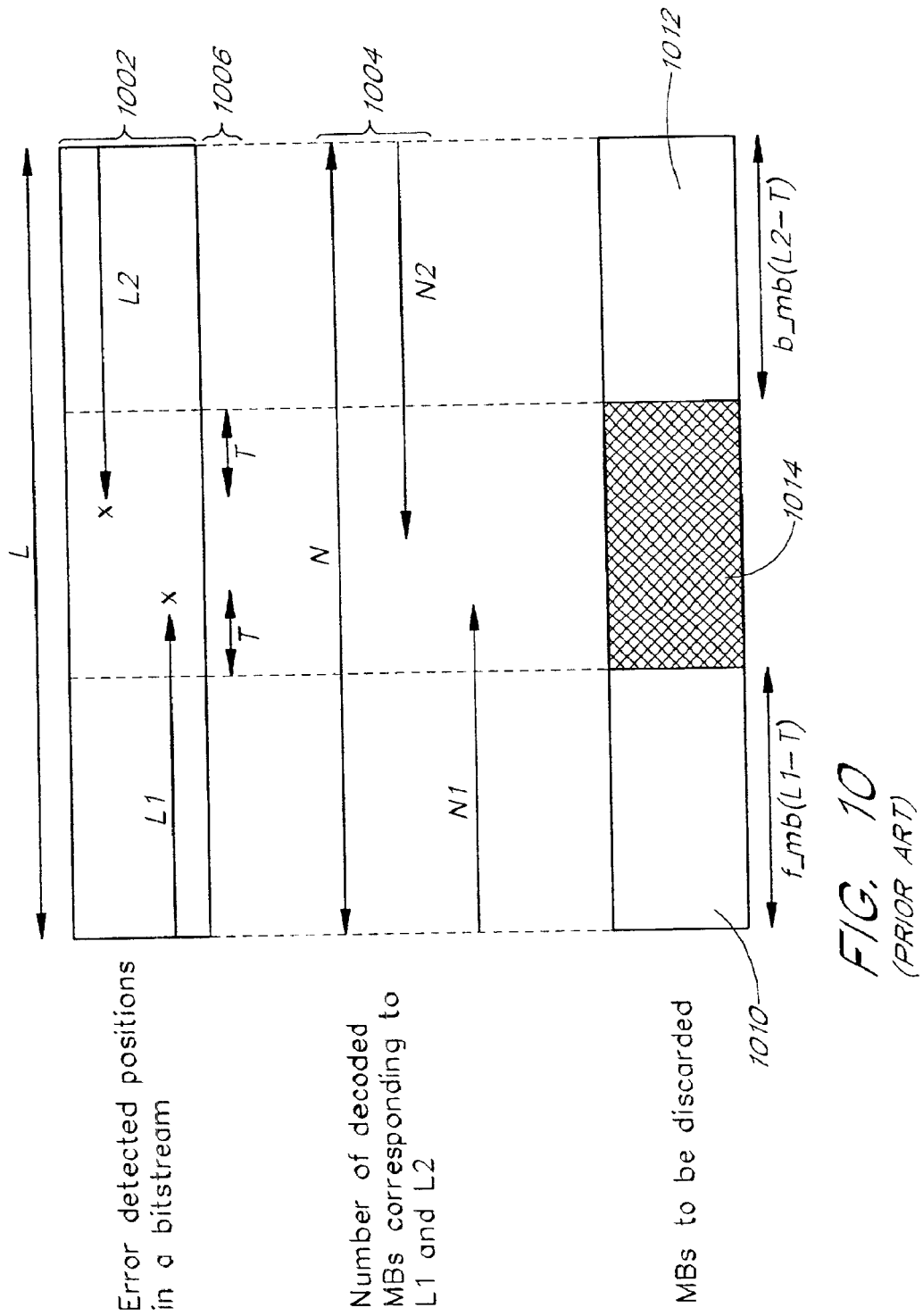
FIGS. 10–13 illustrate partial RVLC decoding strategies.

FIG. 10 illustrates a partial decoding strategy used when $L_1+L_2<L$, and $N_1+N_2<N$. A first portion 1002 of FIG. 10 indicates the bit error positions, $L_1$ and $L_2$. A second portion 1004 indicates the completely decoded macroblocks in the forward direction, $N_1$, and in the reverse direction, $N_2$. A third portion 1006 indicates a backtracking of bits, T, from the bit error locations. It will be understood by one of ordinary skill in the art that the number selected for the backtracking of bits, T, can vary in a very broad range and can even be different in the forward direction and in the reverse direction. In one embodiment, the value of T is 90 bits.

The exemplary process apportions the video packet in a first partial packet 1010, a second partial packet 1012, and a discarded partial packet 1014. The first partial packet 1010 may be used by the decoder and includes complete macroblocks up to a bit position corresponding to $L_1-T$. The second partial packet 1012 may also be used by the decoder and includes complete macroblocks from a bit position corresponding to $L-L_2+T$ to the end of the packet, L, such that the second partial packet is about $L_2-T$ in size. As described in greater detail later in connection with FIG. 14, one embodiment of the process discards intra blocks in the first partial packet 1010 and in the second partial packet 1012, even if the intra blocks are identified as uncorrupted. The discarded partial packet 1014, which includes the remaining portion of the video packet, is discarded.

Figure 11:
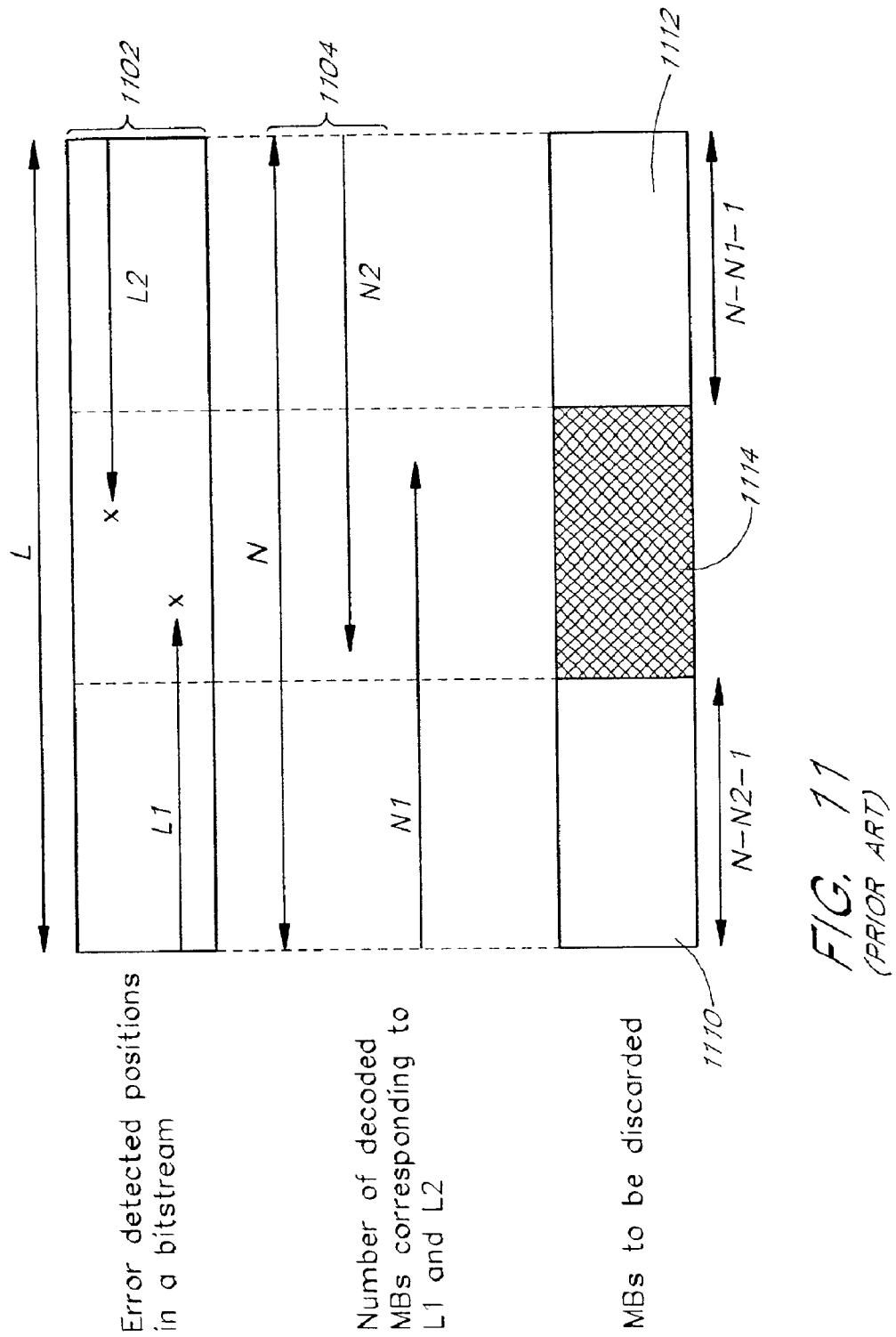

FIG. 11 illustrates a partial decoding strategy used when $L_1+L_2<L$, and $N_1+N_2>=N$. A first portion 1102 of FIG. 11 indicates the bit error positions, $L_1$ and $L_2$. A second portion 1104 indicates the completely decoded macroblocks in the forward direction, $N_1$, and in the reverse direction, $N_2$.

The exemplary process apportions the video packet in a first partial packet 1110, a second partial packet 1112, and a discarded partial packet 1114. The first partial packet 1110 may be used by the decoder and includes complete macroblocks from the start of the video packet to the macroblock corresponding to $N-N_2-1$. The second partial packet 1112 may also be used by the decoder and includes the $(N_1+1)$th macroblock to the last macroblock in the video packet, such that the second partial packet 1112 is about $N-N_1-1$ in size. One embodiment of the process discards intra blocks in the first partial packet 1110 and in the second partial packet 1112, even if the intra blocks are identified as uncorrupted. The discarded partial packet 1114, which includes the remaining portion of the video packet, is discarded.

Figure 12:
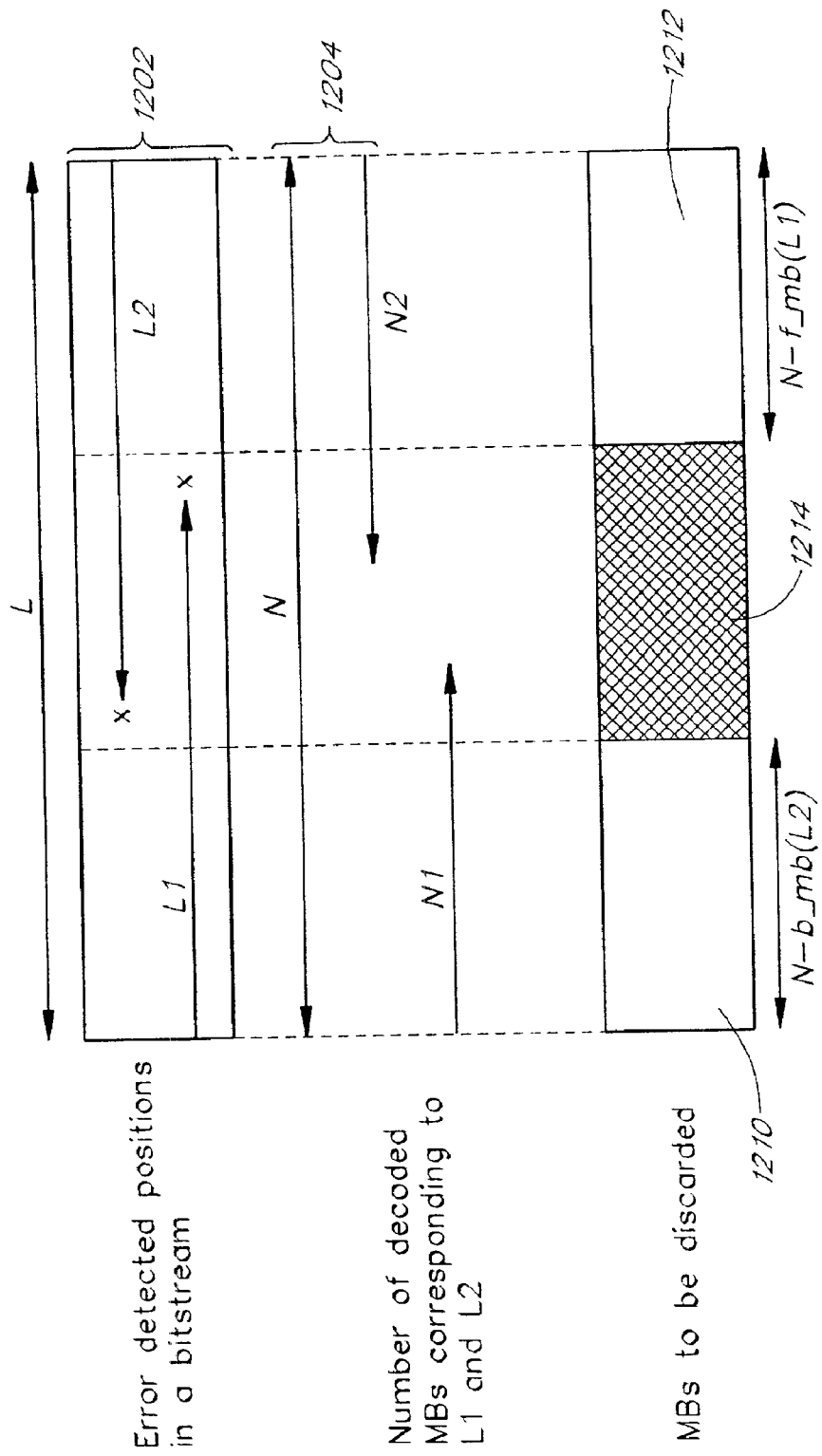

FIG. 12 illustrates a partial decoding strategy used when $L_1+L_2>=L$, and $N_1+N_2<N$. A first portion 1202 of FIG. 12 indicates the bit error positions, $L_1$ and $L_2$. A second portion 1204 indicates the completely decoded macroblocks in the forward direction, $N_1$, and in the reverse direction, $N_2$.

The exemplary process apportions the video packet in a first partial packet 1210, a second partial packet 1212, and a discarded partial packet 1214. The first partial packet 1210 may be used by the decoder and includes complete macroblocks from the beginning of the video packet to a macroblock at $N-b\_mb(L_2)$, where $b\_mb(L_2)$ denotes the macroblock at the bit position $L_2$. The second partial packet 1212 may also be used by the decoder and includes the complete macroblocks from the bit position corresponding to $L_1$ to the end of the packet. One embodiment of the process discards intra blocks in the first partial packet 1210 and in the second partial packet 1212, even if the intra blocks are identified as uncorrupted. The discarded partial packet 1214, which includes the remaining portion of the video packet, is discarded.

Figure 13:
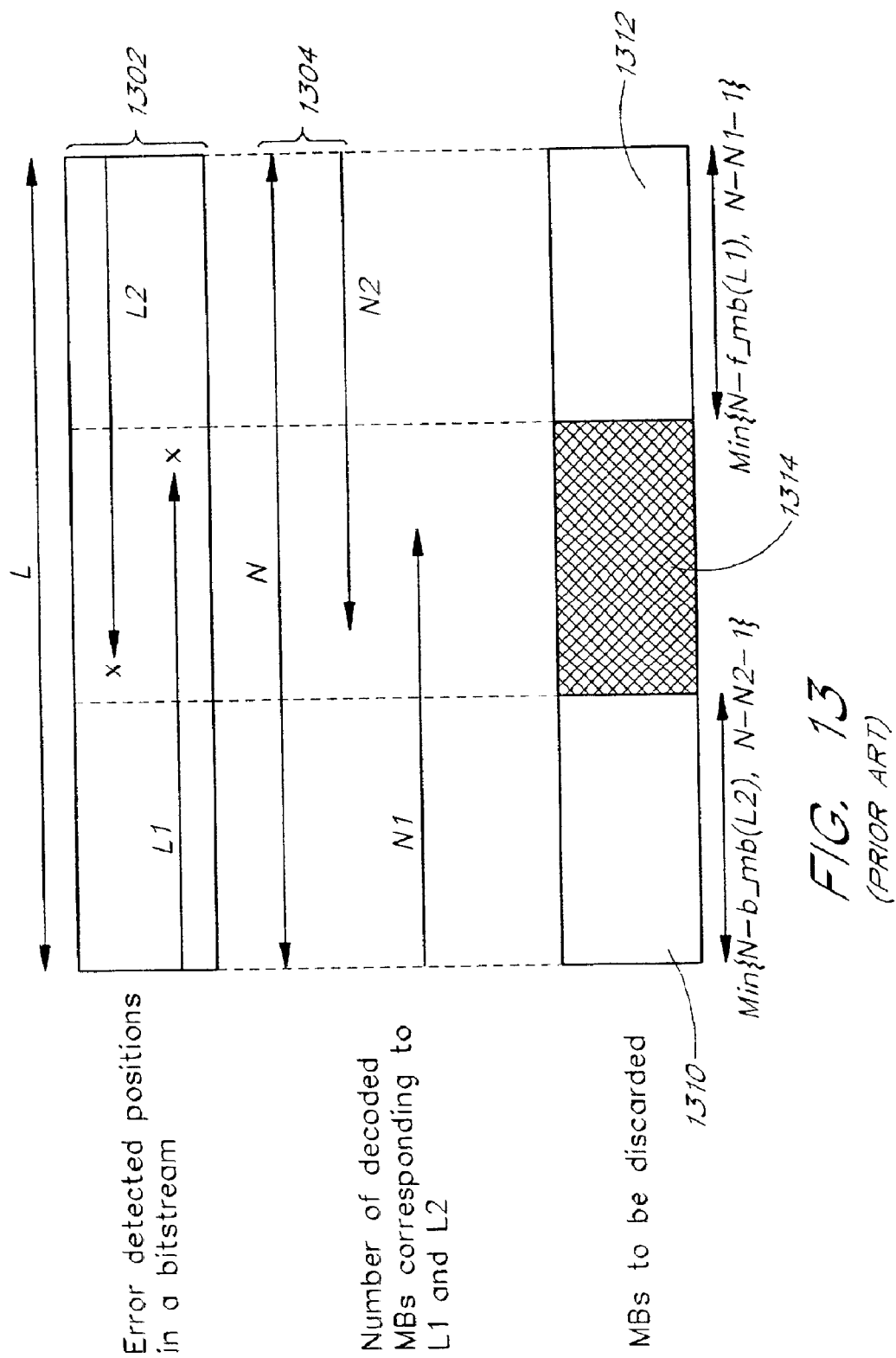

FIG. 13 illustrates a partial decoding strategy used when $L_1+L_2>=L$, and $N_1+N_2>=N$. A first portion 1302 of FIG. 13 indicates the bit error positions, $L_1$ and $L_2$. A second portion 1304 indicates the completely decoded macroblocks in the forward direction, $N_1$, and in the reverse direction, $N_2$.

The exemplary process apportions the video packet in a first partial packet 1310, a second partial packet 1312, and a discarded partial packet 1314. The first partial packet 1310 may be used by the decoder and includes complete macroblocks up to the bit position corresponding to the lesser of $N-b\_mb(L_2)$, where $b\_mb(L_2)$ denotes the last complete macroblock up to bit position $L_2$, and the complete macroblocks up to $(N-N_2-1)$th macroblock. The second partial packet 1312 may also be used by the decoder and includes the number of complete macroblocks counting from the end of the video packet corresponding to the lesser of $N-f\_mb(L_1)$, where $f\_mb(L_1)$ denotes the last macroblock in the reverse direction that is uncorrupted as determined by the forward direction, and the number of complete macroblocks corresponding to $N-N_1-1$. One embodiment of the process discards intra blocks in the first partial packet 1310 and in the second partial packet 1312, even if the intra blocks are identified as uncorrupted. The discarded partial packet 1314, which includes the remaining portion of the video packet, is discarded.

Figure 14:
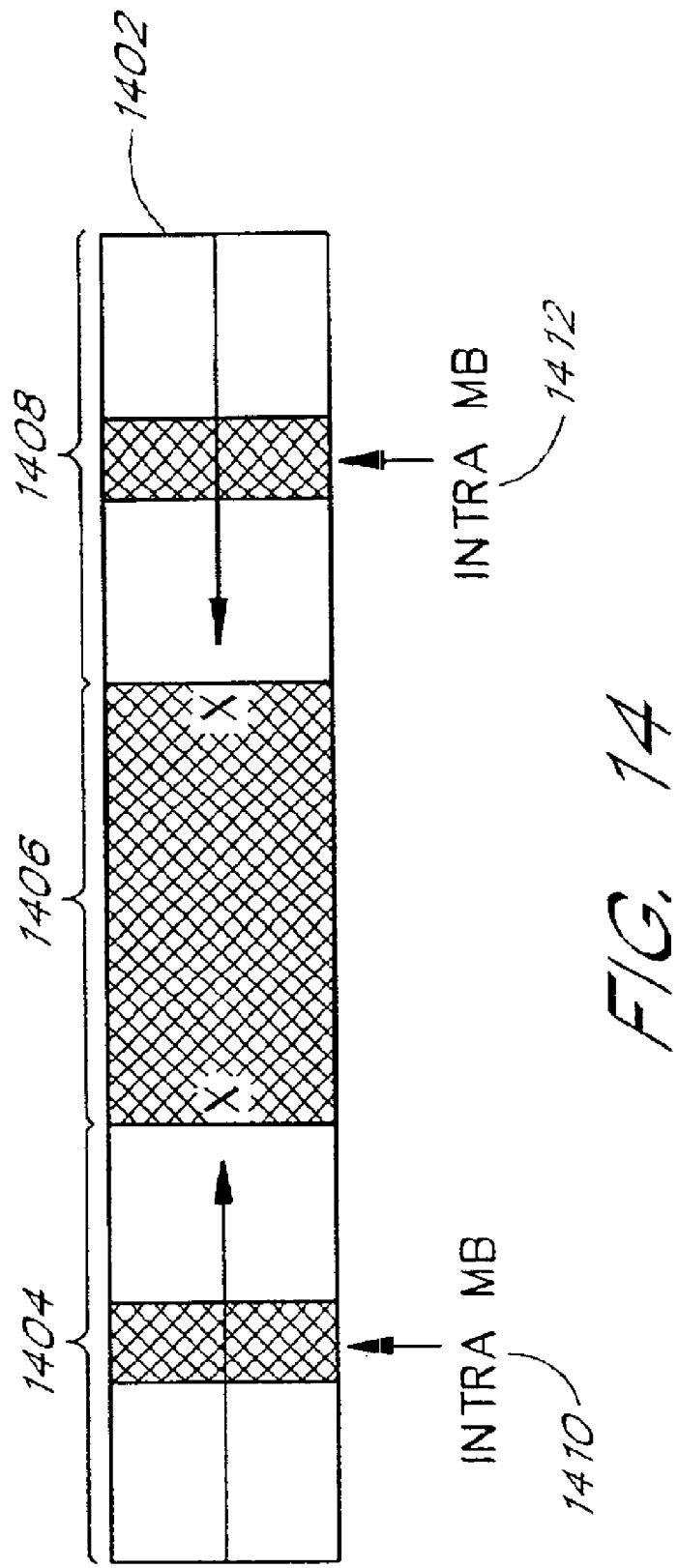
FIG. 14 illustrates a partially corrupted video packet with at least one intra-coded macroblock.

FIG. 14 illustrates a partially corrupted video packet 1402 with at least one intra-coded macroblock. In one embodiment, an intra-coded macroblock in a portion of a partially corrupted video packet is discarded even if the intra-coded macroblock is in a portion of the partially corrupted video packet that is considered uncorrupted.

A decoding process, such as the process described in connection with FIGS. 9 to 13, allocates the partially corrupted video packet 1402 to a first partial packet 1404, a corrupted partial packet 1406, and a second partial packet 1408. The first partial packet 1404 and the second partial packet 1408 are considered error-free and can be used. The corrupted partial packet 1406 includes corrupted data and should not be used.

However, the illustrated first partial packet 1404 includes a first intra-coded macroblock 1410, and the illustrated second partial packet 1408 includes a second intra-coded macroblock 1412. One process according to an embodiment of the invention also discards an intra-coded macroblock, such as the first intra-coded macroblock 1410 or the second intra-coded macroblock 1412, when any error or corruption is detected in the video packet, and the process advantageously continues to use the recovered macroblocks corresponding to error-free macroblocks. Instead, the process conceals the intra-coded macroblocks of the partially corrupted video packets.

One embodiment of the invention partially decodes intra-coded macroblocks from partially corrupted packets. According to the MPEG-4 standard, any data from a corrupted video packet is dropped. Intra-coded macroblocks can be encoded in both I-VOPs and in P-VOPs. As provided in the MPEG-4 standard, a DC coefficient of an intra-coded macroblock and/or the top-row and first-column AC coefficient of the intra-coded macroblock can be predictively coded from the intra-coded macroblock's neighboring intra-coded macroblocks.

Parameters encoded in the video bitstream can indicate the appropriate mode of operation. A first parameter, referred to in MPEG-4 as "intra_dc_vlc_thr," is located in the VOP header. As set forth in MPEG-4, the first parameter, intra_dc_vlc_thr, is encoded to one of 8 codes as described in Table I, where QP indicates a quantization parameter.

TABLE I

| Index | Meaning | Code |
| --- | --- | --- |
| 0 | Use Intra DC VLC for entire VOP | 000 |
| 1 | Switch to Intra AC VLC at running QP >= 13 | 001 |
| 2 | Switch to Intra AC VLC at running QP >= 15 | 010 |
| 3 | Switch to Intra AC VLC at running QP >= 17 | 011 |
| 4 | Switch to Intra AC VLC at running QP >= 19 | 100 |
| 5 | Switch to Intra AC VLC at running QP >= 21 | 101 |
| 6 | Switch to Intra AC VLC at running QP >= 23 | 110 |
| 7 | Use Intra AC VLC for entire VOP | 111 |

The intra_dc_vlc_thr code of "000" corresponds to separating DC coefficients from AC coefficients in intra-coded macroblocks. With respect to an I-VOP, the setting of the intra_dc_vlc_thr parameter to "000" results in the placement by the encoder of the DC coefficient before the DC marker, and the placement of the AC coefficients after the DC marker.

With respect to a P-VOP, the setting of the intra_dc_vlc_thr parameter to "000" results in the encoder placing the DC coefficients immediately after the motion marker, together with the cbpy and ac_pred_flag information. It will be understood that the value of the intra_dc_vlc_thr parameter is selected at the encoding level. For error resilience, video bitstreams may be relatively more robustly encoded with the intra_dc_vlc_thr parameter set to 000. Nonetheless, one embodiment of the invention advantageously detects the setting of the intra_dc_vlc_thr parameter to "000," and monitors for the motion marker and/or the DC marker. If the corresponding motion marker and/or is observed without an error, the process classifies the DC information received ahead of the motion marker and/or DC marker and uses the DC information in decoding. Otherwise, the DC information is dropped.

A second parameter, referred to in MPEG-4 as "ac_pred.flag" is located after the motion marker/DC marker, but before RVLC texture data. The "ac_pred_flag" parameter instructs the encoder to differentially encode and the decoder to differentially decode the top row and first column of DCT coefficients (a total of 14 coefficients) from a neighboring block that has the best match with the current block with regard to DC coefficients. The neighboring block with the smallest difference is used as a prediction block as shown in FIG. 15.

Figure 15:
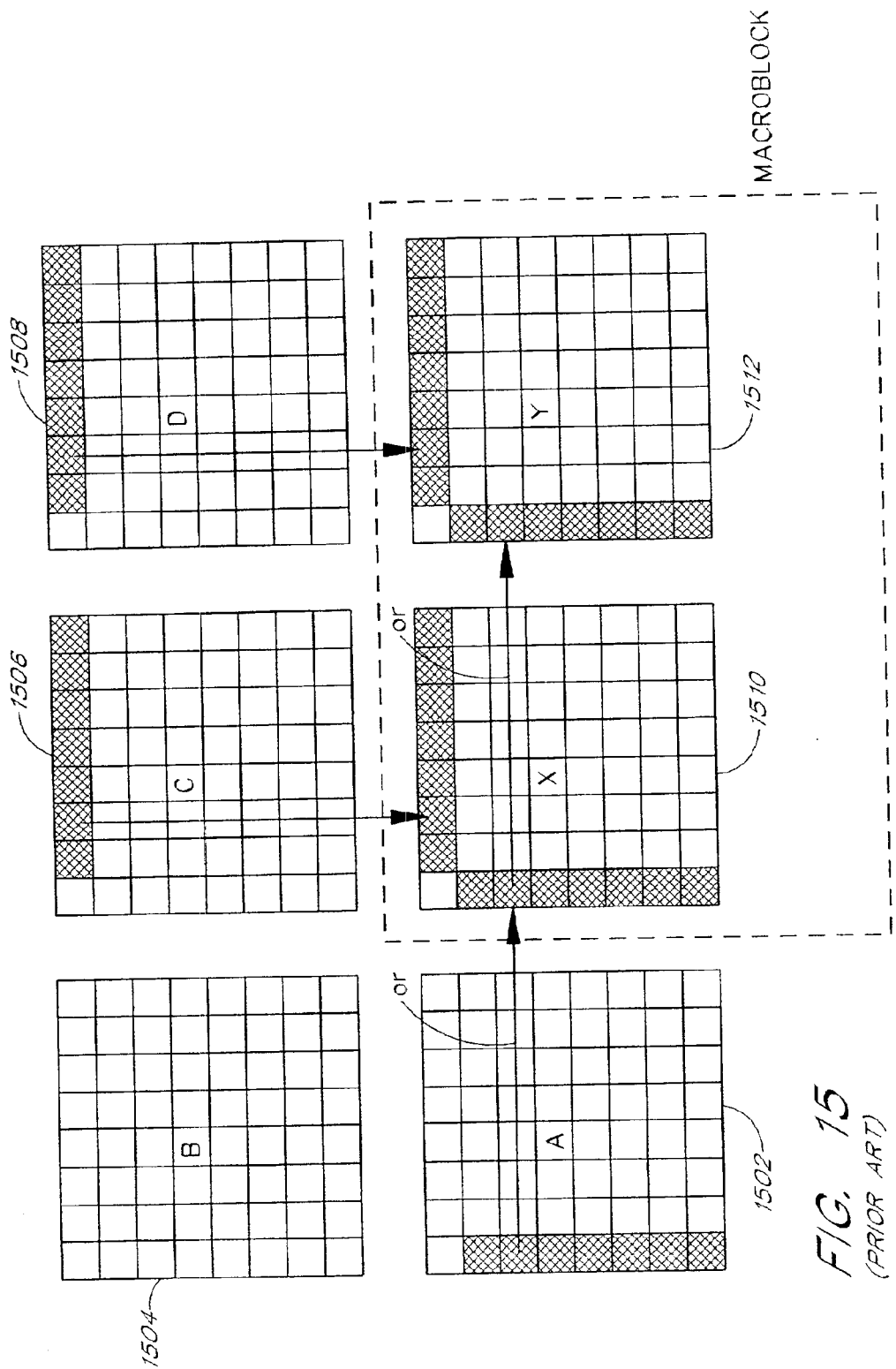
FIG. 15 illustrates a sequence of macroblocks with AC prediction.

FIG. 15 illustrates a sequence of macroblocks with AC prediction. FIG. 15 includes a first macroblock 1502, A, a second macroblock 1504, B, a third macroblock 1506, C, a fourth macroblock 1508, D, a fifth macroblock 1510, X, and a sixth macroblock 1512, Y. The fifth macroblock 1510, X, and the sixth macroblock 1512, Y, are encoded with AC prediction enabled. A first column of DCT coefficients from the first macroblock 1502, A, is used in the fifth macroblock 1510, X, and the sixth macroblock 1512, Y. The top row of coefficients from the third macroblock 1506, C, or from the fourth macroblock 1508, D, is used to encode the top row of the fifth macroblock 1510, X, or the sixth macroblock 1512, Y, respectively.

It will be understood that for error resilience, the encoder should disable the AC prediction or differential encoding for intra-coded macroblocks. With the AC prediction disabled, intra-coded macroblocks that correspond to either the first or second "good" part of the RVLC data can be used.

In one embodiment, with AC prediction enabled, the intra-coded macroblocks of the "good" part of the RVLC data can be dropped as described earlier in connection with FIG. 14.

In addition, one decoder or decoding process according to an embodiment of the invention further determines whether the intra-coded macroblock, referred to as "suspect intra-coded macroblock" can be used even with AC prediction enabled. The decoder determines whether another intra-coded macroblock exists to the immediate left or immediately above the suspect intra-coded macroblock. When no such other intra-coded macroblock exists, the suspect intra-coded macroblock is labeled "good," and is decoded and used.

One decoder further determines whether any of the other macroblocks to the immediate left or immediately above the suspect intra-coded macroblock have not been decoded. If there are any such macroblocks, the suspect intra-coded macroblock is not used.

Figure 16:
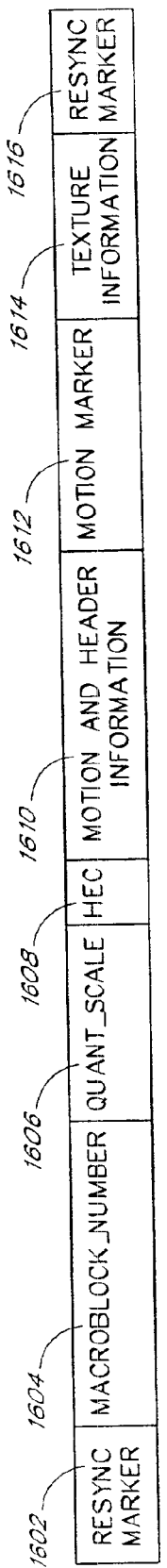
FIG. 16 illustrates a bit structure for an MPEG-4 data partitioning packet.

FIG. 16 illustrates a bit structure for an MPEG-4 data partitioning packet. Data partitioning is an option that can be selected by the encoder. The data partitioning packet includes a resync marker 1602, a macroblock_number 1604, a quant_scale 1606, a header extension code (HEC) 1608, a motion and header information 1610, a motion marker 1612, a texture information 1614, and a resync marker 1616.

The MPEG-4 standard allows the DC portion of frame data to be placed in the data partitioning packet either before or after the AC portion of frame data. The order is determined by the encoder. When data partitioning is enabled, the encoder includes motion vectors together with "not-coded" and "mcbpc" information in the motion and header information 1610 ahead of the motion marker 1612 as part of header information as shown in FIG. 16.

When an error is detected in the receiving of a packet, but the error occurs after the motion marker 1612, one embodiment of the invention uses the data received ahead of the motion marker 1612. One embodiment predicts a location for the motion marker 1612 and detects an error based on whether or not the motion marker 1612 was observed in the predicted location. Depending on the nature of the scenes encoded, the data included in the motion and header information 1610 can yield a wealth amount of information that can be advantageously recovered.

For example, when the "not coded" flag is set, a macroblock should be copied from the same location in the previous frame by the decoder. The macroblocks corresponding to the "not coding" flag can be reconstructed safely. The "mcbpc" identifies which of the 6 8-by-8 blocks that form a macroblock (4 for luminance and 2 for chrominance) have been coded and thus include corresponding DCT coefficients in the texture information 1614.

When RVLC is enabled, the texture information 1614 is further divided into a first portion and a second portion. The first portion immediately following the motion marker 1612 includes "cbpy" information, which identifies which of the 4 luminance 8-by-8 blocks are actually coded and which are not. The cbpy information also includes a DC coefficient for those intra-coded macroblocks in the packet for which the corresponding "Intra DC VLC encoding" has been enabled.

The cbpy information further includes an ac_pred_flag, which indicates whether the corresponding intra-coded macroblocks have been differentially encoded with AC prediction by the encoder from other macroblocks that are to the immediate left or are immediately above the macroblock. In one embodiment, the decoder uses all of or a selection of the cbpy information, the DC coefficient, and the ac_pred_flag in conjunction with the presence or absence of a first error-free portion of the DCT data in the texture information 1614 to assess which part can be safely decoded. In one example, the presence of such a good portion of data indicates that DC coefficients of intra macroblocks and cbpy-inferred non-coded Y-blocks of a macroblock can be decoded.

One technique used in digital communications to increase the robustness of transmitted or stored digital information is forward error correction (FEC) coding. FEC coding includes the addition of error correction information before data is stored or transmitted. Part of the FEC process can also include other techniques such as bit-interleaving. Both the original data and the error correction information are stored or transmitted, and when data is lost, the FEC decoder can reconstruct the missing data from the data that it received and the error correction information.

Figure 17:
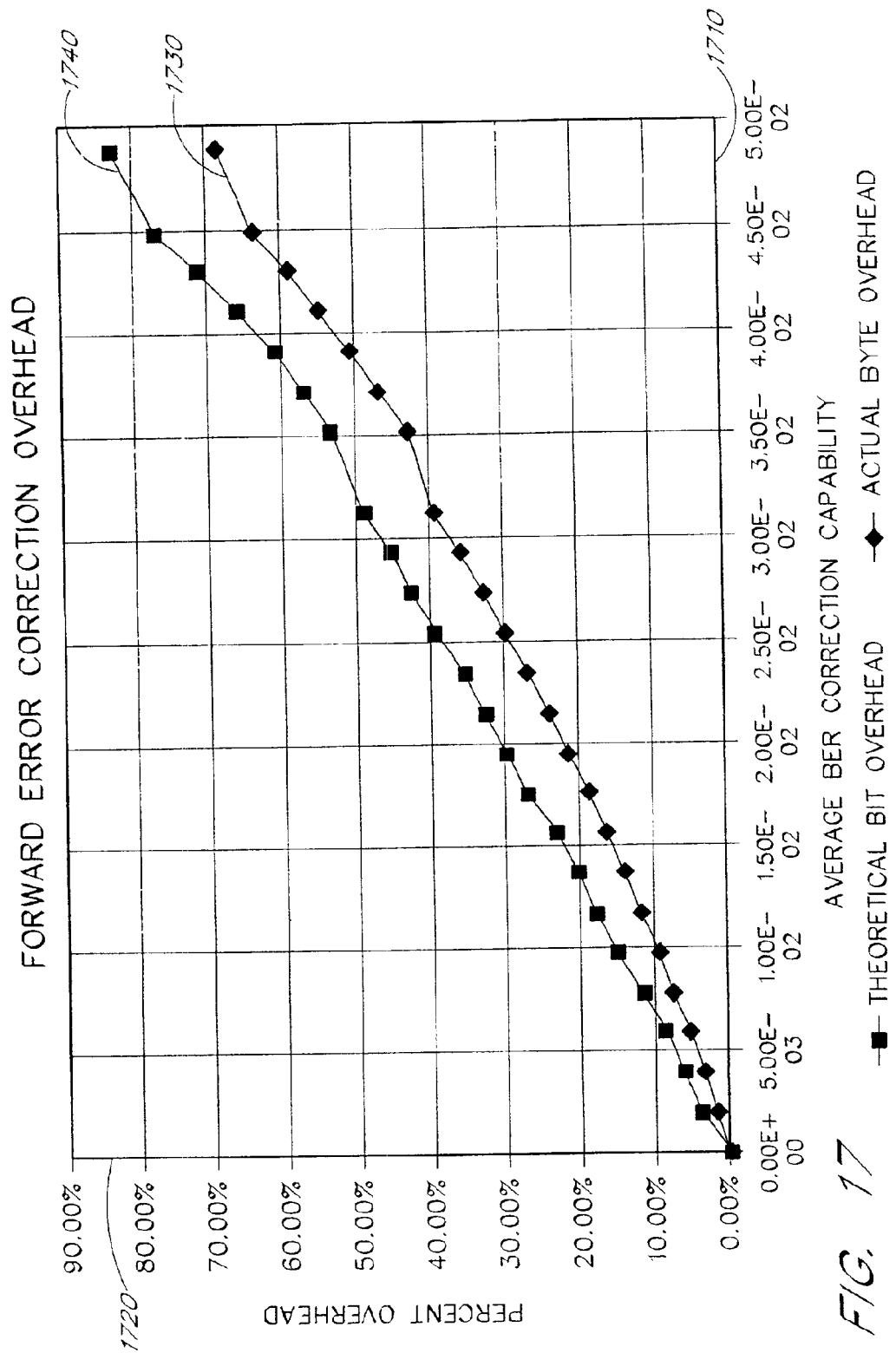
FIG. 17 illustrates one example of a tradeoff between block error rate (BER) correction capability versus overhead.

Advantageously, embodiments of the invention decode FEC codes in an efficient and backward compatible manner. One drawback to FEC coding techniques is that the error correction information increases the amount of data that is stored or transmitted, referred to as overhead. FIG. 17 illustrates one example of a tradeoff between block error rate (BER) correction capability versus overhead. A horizontal axis 1710 corresponds to an average BER correction capability. A vertical axis 1720 corresponds to an amount of overhead, expressed in FIG. 17 in percentage. A first curve 1730 corresponds to a theoretical bit overhead versus BER correction capability. A second curve 1740 corresponds to one example of an actual example of overhead versus BER correction capability. Despite the overhead costs, the benefits of receiving the original data as intended can outweigh the drawbacks of increased data storage or transmission, or the drawbacks of a revised bit allocation in a bandwidth limited system.

Another disadvantage to FEC coding is that the data, as encoded with FEC codes, may no longer be compatible with systems and/or standards in use prior to FEC coding. Thus, FEC coding is relatively difficult to add to existing systems and/or standards, such as MPEG-4.

To be compatible with existing systems, a video bitstream should be compliant with a standard syntax, such as MPEG-4 syntax. To retain compatibility with existing systems, embodiments of the invention advantageously decode FEC coded bitstreams that are encoded only with systematic FEC codes and not non-systematic codes, and retrieve FEC codes from identified user data video packets.

Figure 18:
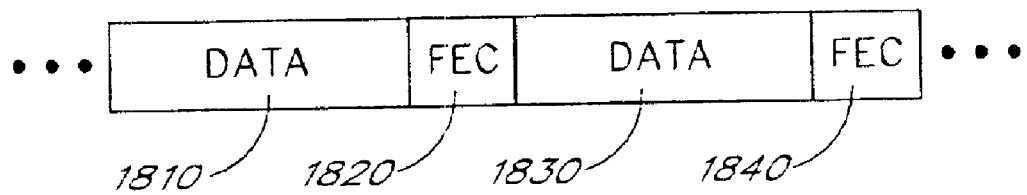
FIG. 18 illustrates a video bitstream with systematic FEC data.

FIG. 18 illustrates a video bitstream with systematic FEC data. FEC codes can correspond to either systematic codes or non-systematic codes. A systematic code leaves the original data untouched and appends the FEC codes separately. For example, a conventional bitstream can include a first data 1810, a second data 1830, and so forth. With systematic coding, the original data, i.e., the first data 1810 and the second data 1830, is preserved, and the FEC codes are provided separately. An example of the separate FEC code is illustrated by a first FEC code 1820 and a second FEC code 1840 in FIG. 18. In one embodiment, the data is carried in a VOP packet, and the FEC codes are carried in a user data packet, which follows the corresponding VOP packet in the bitstream. One embodiment of the encoder includes a packet of FEC codes in a user data video packet for each VOP packet. However, it will be understood that depending on decisions made by the encoder, less than every corresponding data may be supplemented with FEC codes.

By contrast, in a non-systematic code, the original data and the FEC codes are combined. It will be understood by one of ordinary skill in the art that the application of FEC techniques that generate non-systematic code result in bitstreams should be avoided where the applicable video standard does not specify FEC coding.

A wide variety of FEC coding types can be used. In one embodiment, the FEC coding techniques correspond to Bose-Chaudhuri-Hocquenghem (BCH) coding techniques. In one embodiment, a block size of 511 is used. In the illustrated configurations, the FEC codes are applied at the packetizer level, as opposed to another level, such as a channel level.

In the context of an MPEG-4 system, one way of including the separate systematic error correction data, as shown by the first FEC code 1820 and the second FEC code 1840, is to include the error correction data in a user data video packet. The user data video packet can be ignored by a standard MPEG-4 decoder. In the MPEG-4 syntax, a data packet is identified as a user data video packet in the video bitstream by a user data start code, which is a bit string of 000001B2 in hexadecimal (start code value of B2), as the start code of the data packet. Various data can be included with the FEC codes in the user data video packet. In one embodiment, a user data header code identifies the type of data in the user data video packet. For example, a 16-bit code for the user data header code can identify that data in the user data video packet is FEC code. In another example, such as in a standard yet to be defined, the FEC codes of selected data are carried in a dedicated data packet with a unique start code.

It will be appreciated that error correction codes corresponding to all the data in the video bitstream can be included in the user data video packet. However, this disadvantageously results in a relatively large amount of overhead. One embodiment of the invention advantageously encodes FEC codes from only a selected portion of the data in the video bitstream. The user data header code in the user data video packet can further identify the selected data to which the corresponding FEC codes apply. In one example, FEC codes are provided and decoded only for data corresponding to at least one of motion vectors, DC coefficients, and header information.

Figure 19:
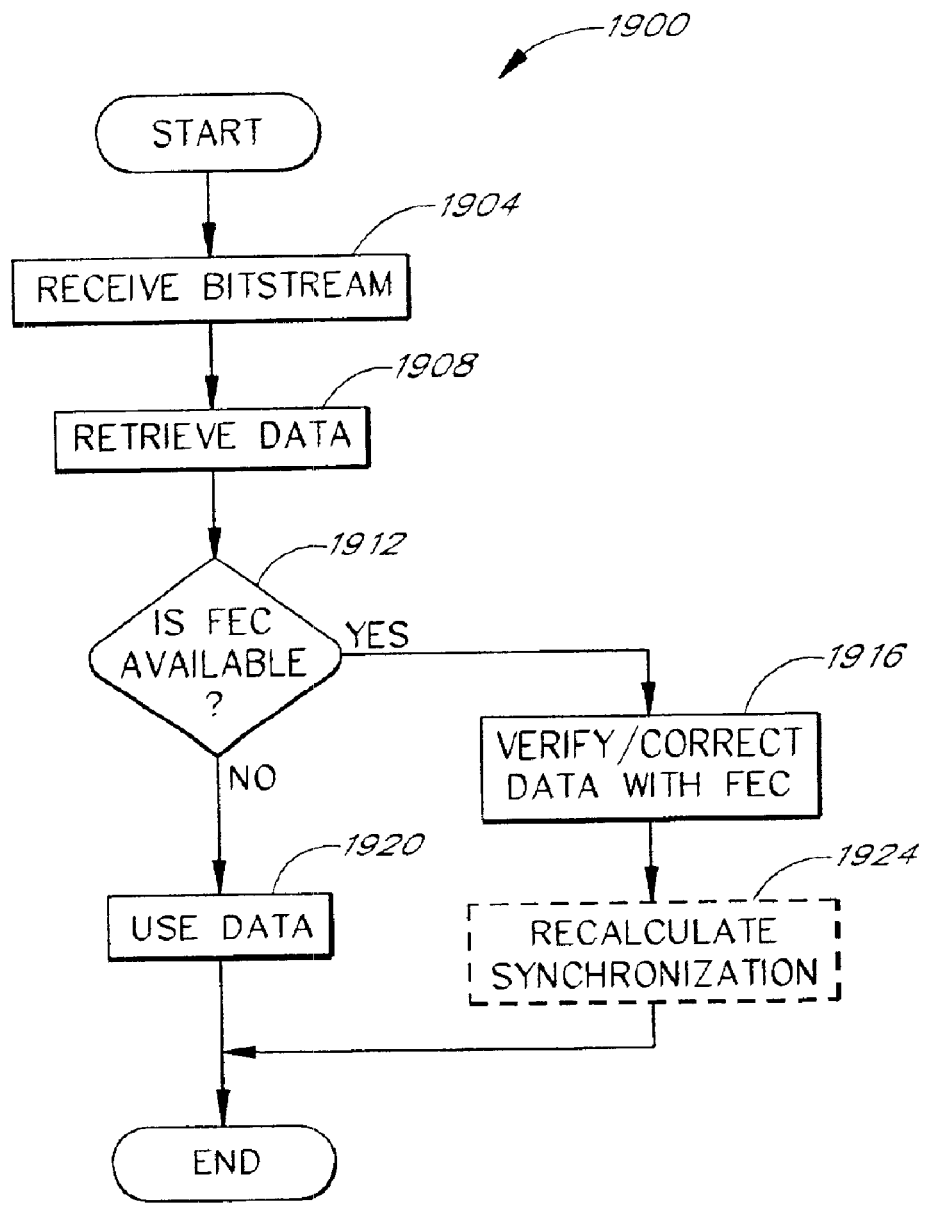
FIG. 19 is a flowchart generally illustrating a process of decoding systematically encoded FEC data in a video bitstream.

FIG. 19 is a flowchart 1900 generally illustrating a process of decoding systematically encoded FEC data in a video bitstream. The process can be activated once per VOP. The decoding process is advantageously compatible with video bitstreams that include FEC coding and those that do not. The process starts at a first state 1904, where the process receives the video bitstream. The video bitstream can be received wirelessly, through a local or a remote network, and can further be temporarily stored in buffers and the like. The process advances from the first state 1904 to a second state 1908.

In the second state 1908, the process retrieves the data from the video bitstream. For example, in an MPEG-4 decoder, the process can identify those portions corresponding to standard MPEG-4 video data and those portions corresponding to FEC codes. In one embodiment, the process retrieves the FEC codes from a user data video packet. The process advances from the second state 1908 to a decision block 1912.

In the decision block 1912, the process determines whether FEC codes are available to be used with the other data retrieved in the second state 1908. When FEC codes are available, the process proceeds from the decision block 1912 to a third state 1916. Otherwise, the process proceeds from the decision block 1912 to a fourth state 1920. In another embodiment, the decision block 1912 instead determines whether an error is present in the received video bitstream. It will be understood that the corresponding portion of the video bitstream that is inspected for errors can be stored in a buffer. When an error is detected, the process proceeds from the decision block 1912 to the third state 1916. When no error is detected, the process proceeds from the decision block 1912 to the fourth state 1920.

In the third state 1916, the process decodes the FEC codes to reconstruct the faulty data and/or verify the correctness of the received data. The third state 1916 can include the decoding of the normal video data that is accompanied with the FEC codes. In one embodiment, only selected portions of the video data supplemented with FEC codes, and the process reads header codes or the like, which indicate the data to which the retrieved FEC codes correspond.

The process advances from the third state to an optional fifth state 1924. One encoding process further includes other data in the same packet as the FEC codes. For example, this other data can correspond to at least one of a count of the number of motion vectors, a count of the number of bits per packet that are encoded between the resync field and the motion marker field. This count allows a decoder to advantageously resynchronize to a video bitstream earlier than at a place in a bitstream with the next marker that permits resynchronization. The process advances from the optional fifth state 1924 to the end. The process can be reactivated to process the next batch of data, such as another VOP.

In the fourth state 1920, the process uses the retrieved video data. The retrieved data can be the normal video data corresponding to a video bitstream without embedded FEC codes. The retrieved data can also correspond the normal video data that is maintained separately in the video bitstream from the embedded FEC codes. The process then ends until reactivated to process the next batch of data.

Figure 20:
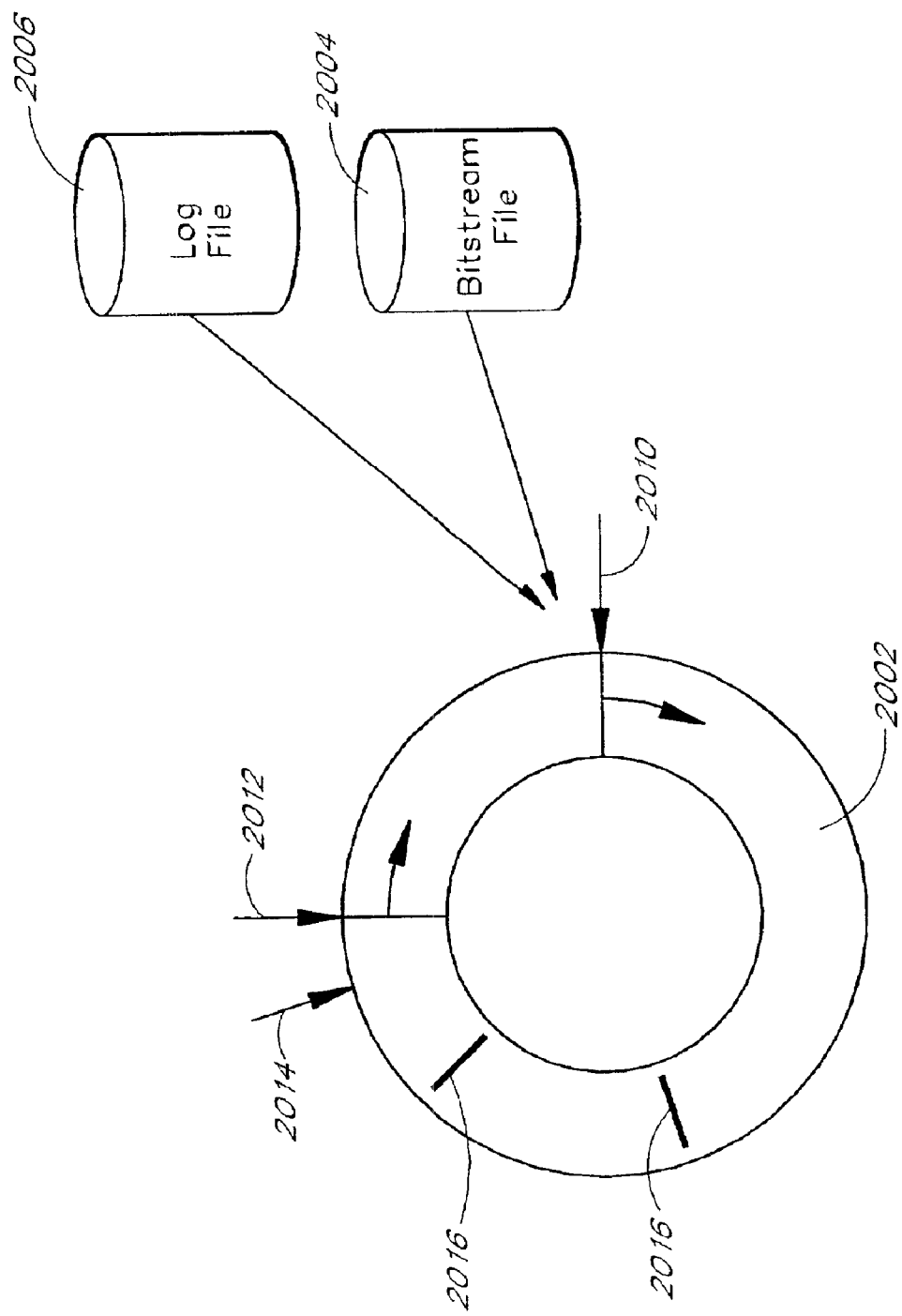
FIG. 20 is a block diagram generally illustrating one process of using a ring buffer in error resilient decoding of video data.

FIG. 20 is a block diagram generally illustrating one process of using a ring buffer in error resilient decoding of video data. Data can be transmitted and/or received in varying bit rates and in bursts. For example, network congestion can cause delays in the receipt of packets of data. The dropping of data, particularly in wireless environments, can also occur. In addition, a relatively small amount of received data can be stored in a buffer until it is ready to be processed by a decoder.

One embodiment of the invention advantageously uses a ring buffer to store incoming video bitstreams for error resilient decoding. A ring buffer is a buffer with a fixed size. It will be understood that the size of the ring buffer can be selected in a very broad range. A ring buffer can be constructed from an addressable memory, such as a random access memory (RAM). Another name for a ring buffer is circular buffer.

The storing of the video bitstream in the ring buffer is advantageous in error resilient decoding, including error resilient decoding of video bitstreams in a wireless MPEG-4 compliant receiver, such as a video-enabled cellular telephone. With error resilient decoding techniques, data from the video bitstream may be read from the video bitstream multiple times, in multiple locations, and in multiple directions. The ring buffer permits the decoder to retrieve data from various portions of the video bitstream in a reliable and efficient manner. In one test, use of the ring buffer sped access to bitstream data by a factor of two.

In contrast to other buffer implementations, data is advantageously not flushed from a ring buffer. Data enters and exits the ring buffer in a first-in first-out (FIFO) manner. When a ring buffer is full, the addition of an additional element overwrites the first element or the oldest element in the ring buffer.

The block diagram of FIG. 20 illustrates one configuration of a ring buffer 2002. Data received from the video bitstream is loaded into the ring buffer 2002 as the data is received. In one embodiment, the modules of the decoder that decode the video bitstream do not access the video bitstream directly, but rather, access the video bitstream data that is stored in the ring buffer 2002. Also, the skilled practitioner will appreciate that the ring buffer 2002 can reside either ahead of or behind a VOP decoder in the data flow. However, the placement of the ring buffer 2002 ahead of the VOP decoder saves memory for the ring buffer 2002, as the VOP is in compressed form ahead of the VOP decoder.

The video bitstream data that is loaded into the ring buffer 2002 is represented in FIG. 20 by a bitstream file 2004. Data logging information, including error logging information, such as error flags, is also stored in the ring buffer 2002 as it is generated. The data logging information is represented in FIG. 20 as a log file 2006. In one embodiment, a log interface between H.223 output and decoder input advantageously synchronizes or aligns the data logging information in the ring buffer 2002 with the video bitstream data.

A first arrow 2010 corresponds to a location (address) in the ring buffer 2002 in which data is stored. As data is added to the ring buffer 2002, the ring buffer 2002 conceptually rotates in the clockwise direction as shown in FIG. 20. A second arrow 2012 indicates an illustrative position from which data is retrieved from the ring buffer 2002. A third arrow 2014 can correspond to an illustrative byte position in the packet that is being retrieved or accessed. Packet start codes 2016 can be dispersed throughout the ring buffer 2002.

When data is retrieved from the ring buffer 2002 for decoding of a VOP with video packets enabled, one embodiment of the decoder inspects the corresponding error-flag of each packet. When the packets are found to be corrupted, the decoder skips the packets until the decoder encounters a clean or error-free packet. When the decoder encounters a packet, it stores the appropriate location information in an index table, which allows the decoder to access the packet efficiently without repeating a seek for the packet. In another embodiment, the decoder uses the contents of the ring buffer 2002 to recover and use data from partially corrupted video packets as described earlier in connection with FIGS. 7–16.

Table II illustrates a sample of contents of an index table, which allows relatively efficient access to packets stored in the ring buffer 2002.

TABLE II

Index - Table Entry

| | Initial Value | Descriptions |
|---|---|---|
| Valid | 0 | Valid flag. A value of 1 indicates that valid data corresponding to this entry information exists in the ring buffer. |
| Past | 0 | Past flag, 0 indicates that this index has a current or future index. |
| Pos | 0 | Start position of the packet, which indicates a position in the ring buffer. |
| ErrorType | 0 | Error type. |
| Size | 0 | Packet Size. |

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention as defined in the appended claims.

APPENDIX A

Incorporation by Reference of Commonly Owned Applications

The following patent applications, commonly owned and filed of the same day as the present application, are hereby incorporated herein in their entirety by reference thereto:

| Title | Application No. | Attorney Docket No. |
|---|---|---|
| SYSTEMS AND METHODS FOR ENHANCED ERROR CONCEALMENT IN A VIDEO DECODER | 10/092,366 | INTV.005A |
| SYSTEMS AND METHODS FOR DECODING OF SYSTEMATIC FORWARD ERROR CORRECTION (FEC) CODES OF SELECTED DATA IN A VIDEO BITSTREAM | 10/092,353 | INTV.007A |
| SYSTEMS AND METHODS FOR MANAGEMENT OF DATA IN A RING BUFFER FOR ERROR RESILIENT DECODING OF A VIDEO BITSTREAM | 10/092,384 | INTV.008A |
| SYSTEMS AND METHODS FOR REDUCING ERROR PROPAGATION IN A VIDEO DATA STREAM | 10/092,340 | INTV.009A |
| SYSTEMS AND METHODS FOR REFRESHING MARCOBLOCKS | 10/092,375 | INTV.010A |
| SYSTEMS AND METHODS FOR REDUCING FRAME RATES IN A VIDEO DATA STREAM | 10/092,345 | INTV.011A |
| SYSTEMS AND METHODS FOR GENERATING ERROR CORRECTION INFORMATION FOR MEDIA STREAM | 10/092,392 | INTV.012A |
| SYSTEMS AND METHODS FOR PERFORMING BIT RATE ALLOCATING FOR A VIDEO DATA STREAM | 10/092,383 | INTV.013A |
| SYSTEMS AND METHODS FOR ENCODING REDUNDANT MOTION VECTORS IN COMPRESSED VIDEO BITSTREAM | 10/092,373 | INTV.014A |
| SYSTEMS AND METHODS FOR DECODING REDUNDANT MOTION VECTORS IN COMPRESSED VIDEO BITSTREAM | 10/092,339 | INTV.015A |
| SYSTEMS AND METHODS FOR DETECTING SCENE CHANGES IN A VIDEO DATA STREAM | 10/092,394 | INTV.016A |

What is claimed is:

1. A method of recovering useful data from a video packet that has been corrupted, the method comprising:

receiving the video packet;

ending without recovering data when corruption is detected in a video packet header of the video packet;

ending without recovering data when corruption is detected in a DC portion of the video packet;

ending without recovering data when corruption is detected in a motion vector portion of the video packet;

initiating decoding of the video packet in a forward direction;

maintaining a first count of a number of macroblocks decoded without error in the forward direction;

storing codewords decoded in the forward direction;

storing a first bit location when an error is first detected in the forward direction;

initiating decoding of the video packet in a reverse direction;

maintaining a second count of a number of macroblocks decoded without error in the reverse direction;

storing codewords decoded in the reverse direction;

storing a second bit location when an error is first detected in the reverse direction;

determining if there is an overlapping region, where the overlapping region corresponds to a region identified in both the forward direction and in the reverse direction as having an error;

if there is an overlapping region, discarding the data in the overlapping region and using the data in a remaining portion of the video packet; and if there is no overlapping region, discarding the data between a first backtracking amount ahead of the first error location in the forward direction and a second backtracking amount behind the second error location in the first location, and recovering the remaining portion of the video packet.

2. The method as defined in claim 1, wherein the first error location and the second error location correspond to bit locations.

3. The method as defined in claim 1, wherein the first error location and the second error location correspond to macroblock boundaries.

4. The method as defined in claim 1, wherein the first backtracking amount and the second backtracking amount are each to a next valid macroblock boundary.

5. The method as defined in claim 1, wherein the first backtracking amount and the second backtracking amount are about 90 bits.

6. The method as defined in claim 1, further comprising discarding recovered data from a corrupted video packet that corresponds to an intra-coded macroblock.

7. The method as defined in claim 1, further comprising:
determining whether AC prediction was disabled by the encoder;
using a recovered intra-coded macroblock if the intra-coded macroblock is recovered from a portion of the video packet that is ahead of a DC marker in the forward direction, where the video packet was encoded with AC prediction disabled; and
otherwise discarding recovered data corresponding to an intra-coded macroblock.

8. The method as defined in claim 1, further comprising using recovered data corresponding to a first intra-coded macroblock only if no other intra-coded macroblock exists to the immediate left of the first intra-coded macroblock and no other intra-coded macroblock exists immediately above the first intra-coded macroblock in the image.

9. The method as defined in claim 1, further comprising concealing errors with gray pixels for portions of the video packet that were not recoverable.

* * * * *